United States Patent
Yang et al.

(10) Patent No.: US 6,801,141 B2
(45) Date of Patent: Oct. 5, 2004

(54) METHOD FOR LOSSLESS DATA COMPRESSION USING GREEDY SEQUENTIAL CONTEXT-DEPENDENT GRAMMAR TRANSFORM

(75) Inventors: En-Hui Yang, Waterloo (CA); Da-ke He, Waterloo (CA)

(73) Assignee: Slipstream Data, Inc., Waterloo (CA)

(*) Notice: Subject to any disclaimer, the term of this patent is extended or adjusted under 35 U.S.C. 154(b) by 0 days.

(21) Appl. No.: 10/438,357

(22) Filed: May 14, 2003

(65) Prior Publication Data

US 2004/0008130 A1 Jan. 15, 2004

Related U.S. Application Data

(60) Provisional application No. 60/395,481, filed on Jul. 12, 2002.

(51) Int. Cl.[7] ............................................. H03M 7/34
(52) U.S. Cl. ..................... 341/51; 341/50; 341/106; 395/754
(58) Field of Search ............................. 341/50–51, 106

(56) References Cited

U.S. PATENT DOCUMENTS

5,678,052 A * 10/1997 Brisson .......................... 704/4
6,492,917 B1 * 12/2002 Goel et al. ..................... 341/60

OTHER PUBLICATIONS

Kieffer et al., "Grammar–Based Codes: A New Class of Universal Lossless Source Codes" May 2000, IEEE Transactions On Information Theory, vol. 46, No. 3, pp. 737–754.*

Yang et al., "Efficient Universal Lossless Data Compression Algorithms Based on a Greedy Sequential Grammar Transform—Part one: Without Context Models" May 2000, IEEE Transactions On Information Theory, vol. 46, No. 3, pp. 755–777.*

Yang, En–Hui, "Method for lossless data compression using greedy sequential grammar transform and sequential encoding", Nov. 14, 2000; U.S. patent application No. 09/711,703.

Rissanen, "Fast Universal Coding with Context Models" May 1999, IEE Transactions on Information Theory, vol. 43, No. 4.

Yang et al., "Efficient Universal Lossless Data Compression Algorighms Based on a Greedy Contect–Dependent Sequential Grammar Transform" Jun. 2001, p. 78, IEEE.

PCT International Search Report for PCT/CA03/01058, Nov. 13, 2003.

Nancy et al., "Universal Lossless Compression Via Multi-level Pattern Matching" Jul. 2000, IEEE Transactions on Information Theory, vol. 46 No. 4.

(List continued on next page.)

*Primary Examiner*—Michael Tokar
*Assistant Examiner*—Khai Nguyen
(74) *Attorney, Agent, or Firm*—Testa, Hurwitz & Thibeault, LLP

(57) ABSTRACT

A method of lossless data compression is provided which uses a grammar transform to sequentially construct a sequence of greedy context-dependent grammars from which an original data sequence can be recovered incrementally. The data sequence is encoded using any one of a sequential context-dependent method, an improved sequential context-dependent method, and a hierarchical context-dependent method.

23 Claims, 12 Drawing Sheets

OTHER PUBLICATIONS

Yang et al., "Efficient Universal Lossless Data Compression Algorithms Based on a Greedy Sequencial Grammar Transform—Part One: Without Context Models" May 2000,pp. 1227–1245, IEEE Transactions on Information Theory, vol. 46 No. 3.

Kieffer et al., "Lossless Data Compression Algorithms Based on Substitution Tables" May 1998, pp. 629–632, Proceedings of IEEE Canadian Conference on Electrical and Computer Engineering, Waterloo, Ontario, Canada.

Yang, et al., "Universal Source Coding Theory Based on Grammar Transforms" Jun. 1999, pp. 75–77 Proceedings of the 1999 IEEE Information Theory and Communications Workshop, Kruger National Park, South Africa.

Kieffer, et al., "Grammar–Based Codes: A New Class of Universal Lossless Source Codes" May 2000, pp. 737–754, IEEE Transactions on Information Theory, vol. 46 No. 3.

Weinberger, et al., "A Sequential Algorithm for the Universal Coding of Finite Memory Sources" May 1992, pp. 1002–1014, IEEE Transactions on Information Theory, vol. 38 No. 3.

Willems, et al., "The Context–Tree Weighting Method: Basic Properties" May 1995. Pp. 653–664, IEEE Transactions on Information Theory, vol. 41 No. 3.

Nevill–Manning, et al., "Compression and Explanation Using Hierarchical Grammars" Mar. 1994.

Apostolico, et al., "Off–Line Compression by Greedy Textual Substitution" Nov. 2000, pp. 1733–1744, Proceedings of the IEEE, vol. 88 No. 11.

U.S. patent application Ser. No. 09/711,703, Yang, filed Nov. 14, 2000.

Willems, "The Context–Tree Weighting Method: Extensions" Mar. 1998, pp. 792–798, IEEE Transactions on Information Theory, vol. 44 No. 2.

Plotnik et al., "Upper Bounds on the Probability of Sequences Emitted by Finite–State Sources and on the Redundancy of the Lempel–Ziv Algorithm" Jan. 1992, pp. 66–72, IEEE Transactions on Information Theory, vol. 38, No. 1.

Ziv et al., "Compression of Individual Sequences via Variable–Rate Coding" Sep. 1978, pp. 530–536, IEEE Transactions on Information Theory, vol. IT–24, No. 5.

Rissanen et al., "Universal Modeling and Coding" Jan. 1981, IEEE Transactions on Information Theory, vol. IT–27 No. 1.

* cited by examiner

METHOD FOR LOSSLESS DATA COMPRESSION USING GREEDY SEQUENTIAL CONTEXT-DEPENDENT GRAMMAR TRANSFORM

CROSS-REFERENCE TO RELATED APPLICATIONS

This application claims priority to U.S. provisional patent application Ser. No. 60/395,481, entitled "Improved Method For Lossless Data Compression Using Greedy Sequential Context-Dependent Grammar Transform", filed Jul. 12, 2002.

FIELD OF THE INVENTION

The invention relates generally to the field of data compression and more particularly to the use of a sequential grammar transform and encoding methods to compress data with a known context.

BACKGROUND OF THE INVENTION

Universal data compression methods can be divided into two subdivisions: universal lossless data compression and universal lossy data compression. Conventional universal lossless data compression methods typically employ arithmetic coding algorithms, Lempel-Ziv algorithms, and their variants. Arithmetic coding algorithms are based on statistical models of the data to be compressed. To encode a data sequence using an arithmetic coding algorithm, a statistical model is either built dynamically during the encoding process, or assumed to exist in advance. Several approaches exist to build a statistical model dynamically, including prediction by partial match algorithm; dynamic Markov modeling; context gathering algorithm; and context-tree weighting. Each of these methods predicts the next symbol in the data sequence using the proper context and encodes the symbols using their corresponding, estimated conditional probabilities.

Most arithmetic coding algorithms and their variants are universal only with respect to the class of Markov sources with a Markov order less than some designed parameter value. Furthermore, arithmetic coding algorithms encode the data sequence letter by letter.

In contrast, Lempel-Ziv algorithms and their variants do not use statistical models. Lempel-Ziv algorithms parse the original data sequence into non-overlapping, variable length phrases according to a string matching mechanism, and then encode them phrase by phrase. In addition, Lempel-Ziv algorithms are universal with respect to a broader class of sources than the class of Markov sources of bounded order, that being the class of stationary, ergodic sources.

Other conventional universal compression methods include the dynamic Huffman algorithm, the move-to-front coding scheme, and some two-stage compression algorithms with codebook transmission. These conventional methods are either inferior to arithmetic coding and Lempel-Ziv algorithms or too complicated to implement. More recently, a new class of lossless data compression algorithms based on substitution tables was proposed that includes a new coding framework, but no explicit data compression algorithms were introduced. However, this method has a disadvantage in that the greedy sequential transformation used in the encoding process is difficult to implement and does not facilitate efficient coding because the initial symbol $s_0$ is involved in the parsing process.

Furthermore, these algorithms do not assume any prior knowledge about the data sequences being compressed. While making them suitable for general purpose data compression needs, they are not particularly efficient for specific applications of data compression. In many instances, such as compression of web pages, java applets, or text files, there is often some a priori knowledge about the data sequences being compressed. This knowledge can often take the form of so-called "context models."

What is needed is a method of universal lossless data compression that overcomes the above-described disadvantages of existing compression methods while taking advantage of the a priori knowledge of the context of the data sequence being compressed.

SUMMARY OF THE INVENTION

In accordance with the present invention, a universal lossless data compression method is provided. This method employs source coding to construct on-line, tuneable, context-dependent compression rules. Unlike alternative methods previously used that compress the individual objects, this method compresses the numerical set of rules. To achieve on-line compression of web-based data for example, the method receives the data, constructs the rules dynamically, and then encodes the rules. Because the set of rules is dynamic, when the structure of web text data changes, the corresponding rules are updated; similarly, when the content of web objects is updated, the corresponding rules are updated accordingly. This approach is particularly efficient for encoding web pages, because the content of a web page can change often, while the underlying structure of a web page remains approximately constant. The relative consistency of the underlying structure provides the predictable context for the data as it is compressed.

One aspect of the invention relates to a method of sequentially transforming an original data sequence associated with a known context into an irreducible context-dependent grammar, and recovering the original data sequence from the grammar. The method includes the steps of parsing a substring from the sequence, generating an admissible context-dependent grammar based on the parsed substring, applying a set of reduction rules to the admissible context dependent grammar to generate a new irreducible context-dependent grammar, and repeating these steps until the entire sequence is encoded. In addition, a set of reduction rules based on pairs of variables and contexts represents the irreducible context-dependent grammar such that the pairs represent non-overlapping repeated patterns and contexts of the data sequence.

In another aspect of the invention, the method relates the use of adaptive context-dependent arithmetic coding to encode an irreducible context-dependent grammar associated with a known context model from a countable context model set. Furthermore, a set of reduction rules are applied to represent the irreducible context-dependent grammar based on pairs of variables and contexts such that the pairs represent non-overlapping repeated patterns and contexts of the data sequence.

In yet another aspect of the invention, a method is provided to encode an data sequence with a known context model by transforming the data sequence into a irreducible context-dependent grammar; converting the irreducible context-dependent grammar into its sorted form; constructing a generated sequence from the sorted irreducible context-dependent grammar; and encoding the generated sequence using an adaptive context-dependent arithmetic code.

The invention also relates to a method of sequentially transforming an original data sequence associated with a known context model into a sequence of irreducible context-dependent grammars; and further encoding the data sequence based on each of the irreducible context-dependent grammars by using adaptive context-dependent arithmetic coding. The method comprises the steps of parsing a substring from the sequence, encoding the substring by utilizing the structure of the previous irreducible context-dependent grammar and by using adaptive context-dependent arithmetic coding, generating an admissible context-dependent grammar based on the substring, the current context, and the previous irreducible context-dependent grammar, applying a set of reduction rules to the admissible context-dependent grammar to generate a new irreducible context-dependent grammar, and repeating these steps until all of the symbols of the sequence are parsed and coded.

BRIEF DESCRIPTION OF THE DRAWINGS

The above and further advantages of this invention may be better understood by referring to the following description in conjunction with the accompanying drawings.

DETAILED DESCRIPTION

The following notation is used in this description of the invention. A will be used to refer to a source alphabet with cardinality greater than or equal to 2. A* will be used to refer to the set of all finite strings drawn from A, including the empty string $\lambda$, and A$^+$ will be used to refer to the set of all finite strings of positive length from A. The notation $|A|$ stands for the cardinality of A, and for any $x \in A^*$, $|x|$ denotes the length of x. For any positive integer n, A$^n$ denotes the set of all sequences of length n from A. A sequence from A can also be called an A-sequence. $x \in A^+$ will be used to represent the sequence to be compressed. The source alphabet A is application-dependent. Define a countable set $S=\{s_0, s_1, s_2, \ldots\}$ of symbols, disjoint from $A \cup C$. Symbols in S will be called variables; symbols in A will be called terminal symbols. For any $j \geq 1$, let $S(j)=\{s_0, s_1, \ldots, s_{j-1}\}$.

C will be used to define an arbitrary set of contexts. The set C may be finite or infinite. In a general context model, for any sequence $x=x_1 x_2 \ldots x_n$ drawn from alphabet A there is a context sequence $C_1 C_2 \ldots C_n$ from C. In this context sequence, each $C_1$ will represent the context for $x_i$. Before encoding $x_i$, $C_i$ can be determined from all history $x_1 x_2 \ldots x_{i-1}$ and $C_1$ in some manner. A representation of this relationship is:

$$C_{i+1}=f(x_1, \ldots, x_i, C_1), i=1,2, \ldots, \qquad (1)$$

where $C_1 \in C$ is an initial, fixed context and $f$ is a mapping which is referred to herein as a "next context function." The properties described above can be further extended to so-called Countable Context Models, wherein (1) still holds and the context set C is countably infinite.

G will be used to represent a context-dependent grammar mapping from a subset of $C \times S(j)$ to $(S(j) \cup A)^+$ for some $j \geq 1$. The set S(j) will be referred to as the variable set of G and, the elements of S(j) will be referred to as G-variables. The domain of G can then be represented as $\Omega_G(K_i, j_i) \subset C \times S(j)$, where K is the number of distinct contexts in the domain. Within $\Omega_G(K_i, j_i)$, there is a special pair $(C_1, s_0) \in \Omega_G(K_i, j_i)$ that represents the initial pair in which $C_1$ can be used to identify the initial context.

One approach to describing the mapping between a variable, its context, and the context-dependent grammar is to define, for each pair $(C^k, s_i) \in \Omega_G(K_i, j_i)$, the relationship $(s_i | C^k, G(s_i | C^k))$ as $s_i | C^k \to G(s_i | C^k)$ as a production rule. The context-dependent grammar G can then be completely described by a set of production rules given by $\{s_i | C^k \to G(s_i | C^k) : (C^k, s_i) \in \Omega_G(K_i, j_i), 0 \leq i < j, 0 < k < \infty\}$.

Figure 1:
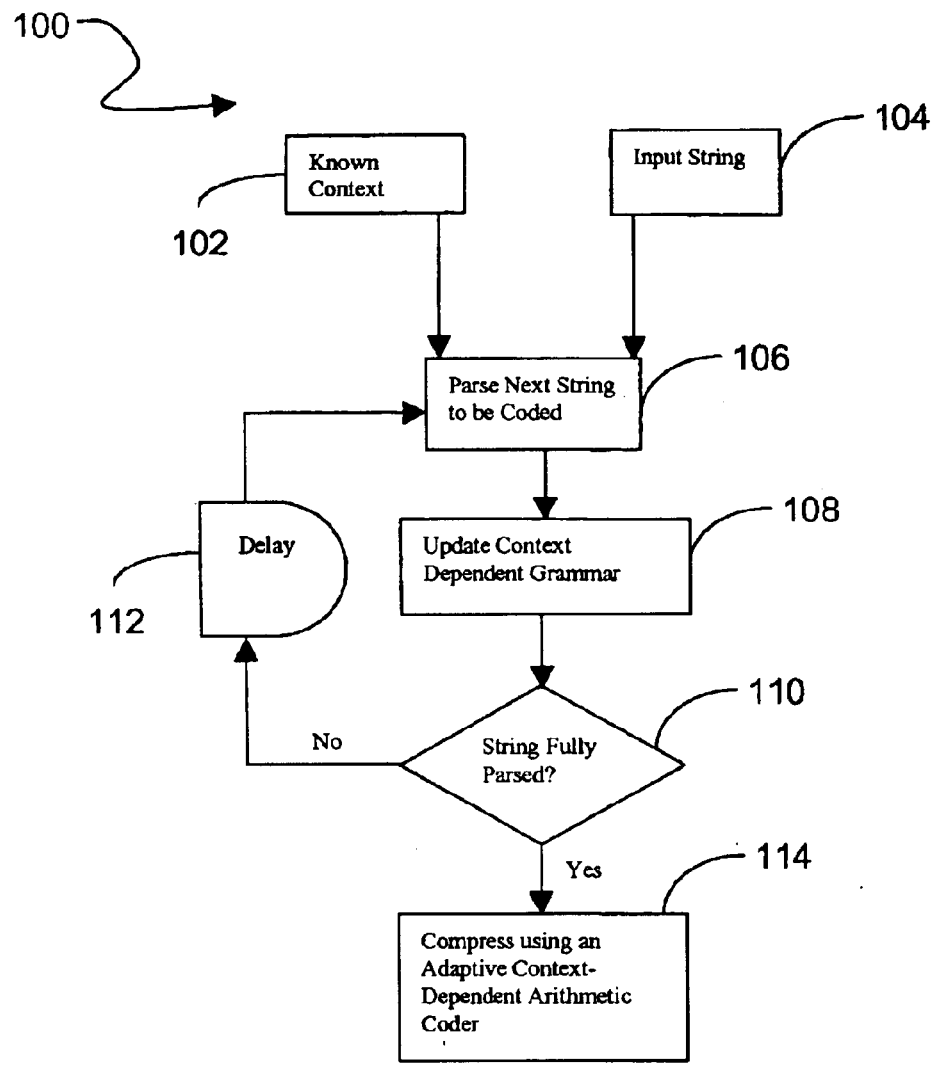
FIG. 1 is a flow chart illustrating a sequence of operations for a context-dependent grammar transform in accordance with an embodiment of the present invention.
Figure 2:
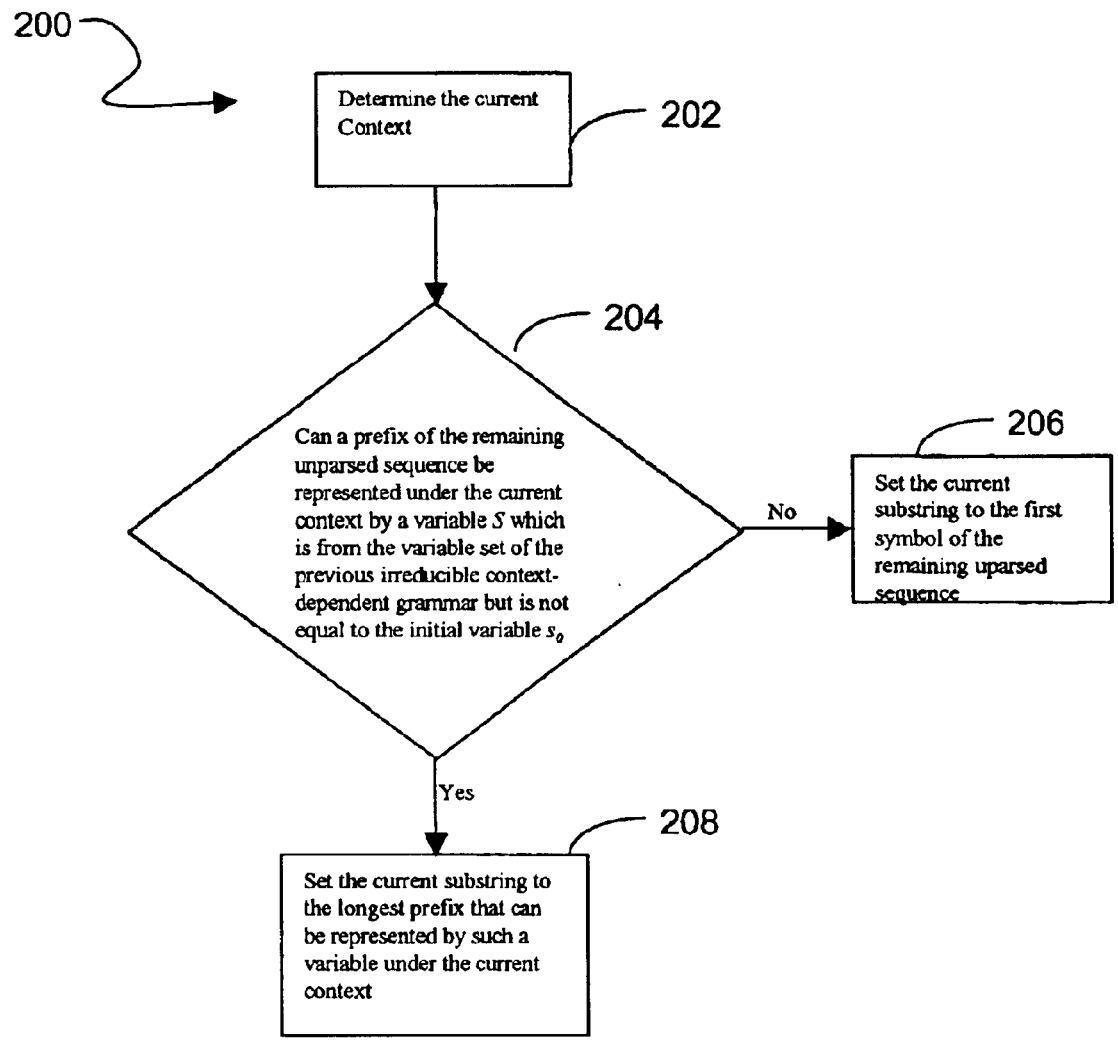
FIG. 2 is a flow chart illustrating a sequence of operations for parsing a substring of an input string under a known context in accordance with an embodiment of the present invention.
Figure 3:
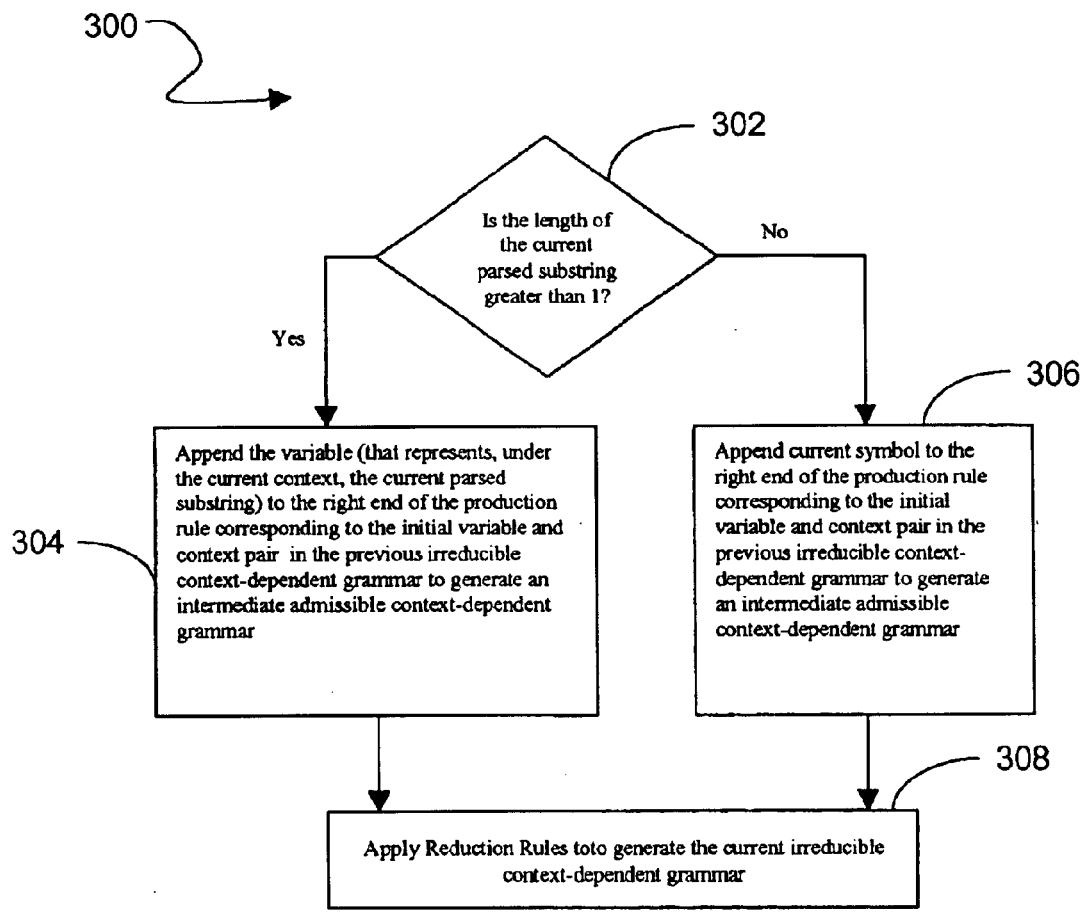
FIG. 3 is a flow chart illustrating a sequence of operations for updating an irreducible context-dependent grammar in accordance with an embodiment of the present invention.

In one illustrative embodiment, and referring to FIG. 1, a method 100 may be used to implement data compression in accordance with the present invention. The method 100 has as inputs a known context 102 and an input string 104. A parser receives the context 102 and input string 104 and parses the input string 104 into a set of non-overlapping substrings (STEP 106). The parsing step (STEP 202) is further illustrated in FIG. 2 by a method 200. The parsing step (STEP 202) comprises determining the context of the current substring (STEP 202), and determining if the current substring can be represented under the current context (STEP 204). If the current substring cannot be represented by the current context, set the current substring equal to the next symbol under the current context (STEP 206). Alternatively, if the current substring can be represented by the current context, set the current substring equal to the longest prefix that represents the substring (STEP 208). Returning to FIG. 1, the parser transmits the substrings to a context-dependent grammar updating device, which then updates a context-dependent grammar G (STEP 108). The updating step (STEP 108) is further illustrated in FIG. 3 by a method 300. If the length of the current parsed string is greater than 1, (STEP 302) append the current variable to the end of the previous irreducible context-dependent grammar (STEP 304), and follow by applying a set of reduction rules, (STEP 308) as described below. Alternatively, if the length of the current parsed string is not greater than 1, append the current symbol to the end of the previous irreducible context-dependent grammar (STEP 306), and follow by applying a set of reduction rules, (STEP 308) as described below. Returning again to FIG. 1, if the input string is not fully parsed (STEP 110) the method is repeated after a delay (STEP 112). A context-dependent arithmetic coder then compresses the grammar into a binary codeword (STEP 114).

EXAMPLE 1

In this example, the source alphabet can be defined such that A={0,1}. Further, a countable context-model can be defined such that C={0,1} and having a next context function $f$ as $C_{i+1}=x_i$. One possible example of a context-dependent grammar G with a variable set $\{s_0,s_1,s_2\}$ and an initial pair of $(0,s_0)$ is:

$$s_0|0 \rightarrow s_1 s_1 1 s_2 0 s_1 s_2 s_1 0$$

$$s_1|0 \rightarrow 001$$

$$s_1|1 \rightarrow 01$$

$$s_2|1 \rightarrow 1s_1$$

In the above Example 1, G can be defined with a variable set S(j) and an initial pair of $(C_1,s_0)$. By repeatedly substituting G(s|C) for the first variable s from the left in $G(s_0|C_1)$, where C is determined from $C_1$ and the prefix up to s in $G(s_0|C_1)$ according to formula (1) above, one of the following conditions will be met:

(1) after a finite number of replacement steps, a sequence from A is obtained;

(2) the replacement procedure never ends because each string so obtained contains an entry which is a G-variable;

(3) the replacement procedure can not continue because the production rule corresponding to s|C is not defined in G.

Continuing Example 1, and adhering to conditions (1)–(3) above, the following replacements can be made:

$$s_0|0 \xrightarrow{G} s_1 s_1 1 s_2 0 s_1 s_2 s_1 0$$

$$\xrightarrow{G} 001 s_1 1 s_2 0 s_1 s_2 s_1 0$$

$$\xrightarrow{G} 001011 s_2 0 s_1 s_2 s_1 0$$

$$\xrightarrow{G} 0010111 s_1 0 s_1 s_2 s_1 0$$

$$\xrightarrow{G} 00101110 s_1 s_2 s_1 0$$

$$\xrightarrow{G} 001011101000 l s_2 s_1 0$$

$$\xrightarrow{G} 0010111010001 l s_1 s_1 0$$

$$\xrightarrow{G} 001011101000110 l s_1 0$$

$$\xrightarrow{G} 0010111010001101010$$

In Example 1 above, a sequence can be obtained from A by applying the following process. Start with $s_0|0 \rightarrow G(s_0|0)$, and repeatedly apply the serial replacement procedure. After nine steps, (each appearance of the notation $$\xrightarrow{G}$$

represents one step of the replacement procedure), the serial replacement procedure terminates. Furthermore, each variable $s_i(0 \leq i < 3)$ under the context $C^k(1 \leq k \leq 2)$ such that a production rule for $s_i|C^k$ is defined in G is replaced at least once by $G(s_i|C^k)$ in the entire replacement process. Therefore, in this example, $s_0$ under the context 0 (or G) represents the sequence x=0010111010001101010. Each of the other G-variables represents one or more substrings of x: $s_1$ represents 001 under the context 0 and 01 under the context 1, and $s_2$ represents 101 under the context 1. To further illustrate the context-dependent characteristics of this method, it should be noted that the substring "01" appears twice in the range of the context-dependent grammar G. These two substrings are not, however, repeated strings in the context-dependent sense because each has a different context.

An admissible context-dependent grammar G can be defined as irreducible if the following conditions are satisfied:

(1) For any context C, each G-variable s such that $(C,s) \in \Omega_G(K,j) \setminus \{(C_1,s_0)\}$ appears at least twice under C in the range of G;

(2) in the context-dependent sense, there is no non-overlapping repeated pattern of length greater than or equal to 2 in the range of G;

(3) under the same context C, each distinct G-variable $s \in \{s: (C,s) \in \Omega_G(K,j)\}$ represents a distinct A-sequence.

Therefore, the admissible context-dependent grammar in the above-described Example 1 is irreducible.

A grammar transform is a transformation that converts any data sequence $x \in A^+$ into an admissible context-dependent grammar $G_x$ that represents x. A grammar transform is said to be irreducible if $G_x$ is irreducible for all $x \in A^+$. Starting with an admissible context-dependent grammar G that represents x, a set of reduction rules can be repeatedly applied to generate another admissible context-dependent grammar G' that represents the same x and satisfies the following properties:

(1) The size |G| of G should be small enough, compared to the length of x;

(2) A-strings represented by distinct variables of G under the same contexts are distinct;

(3) the context-dependent frequency distribution of variables and terminal symbols of G in the range of G should be such that effective context-dependent arithmetic coding can be applied.

Figure 4:
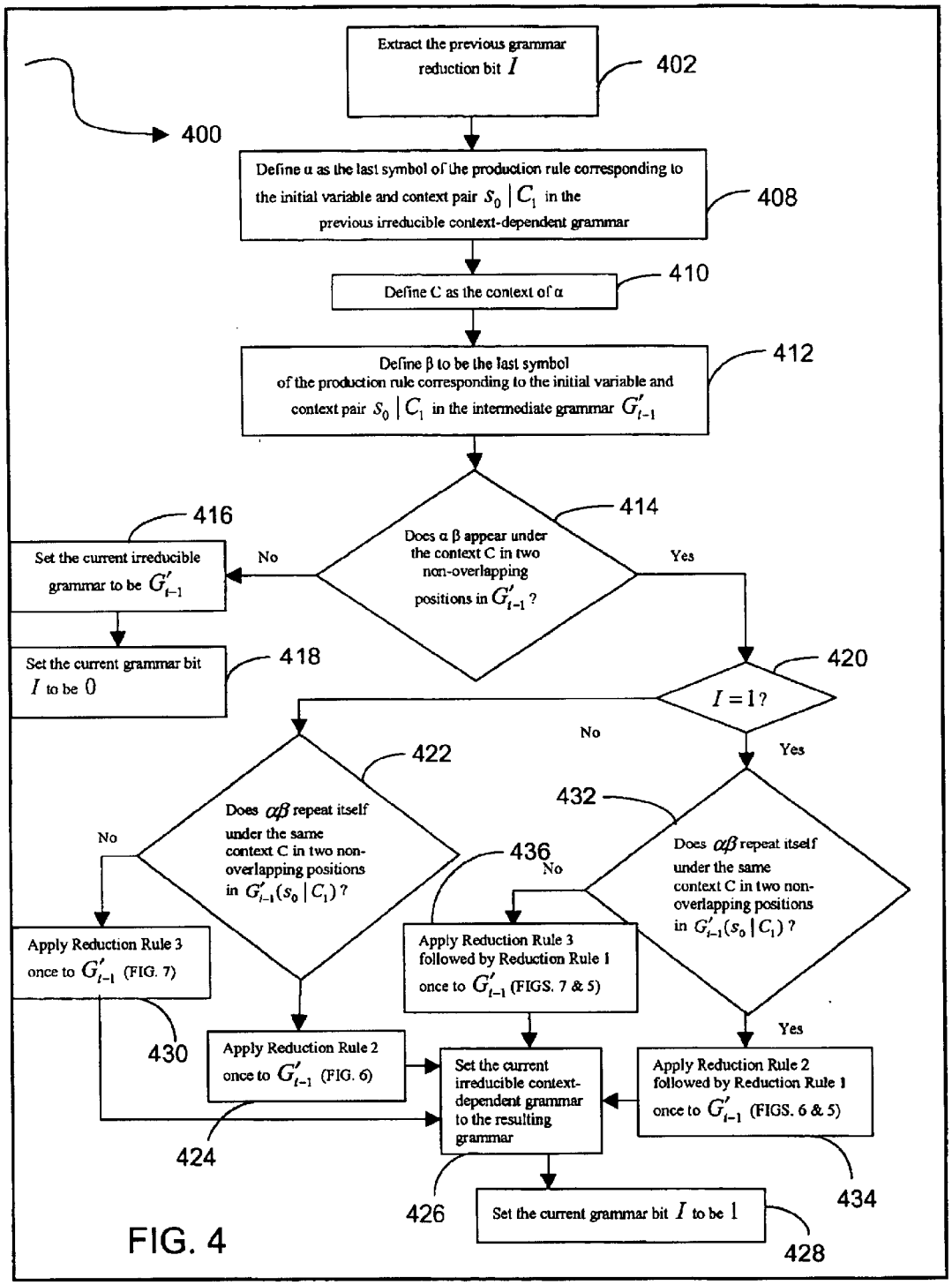
FIG. 4 is a flow chart illustrating a sequence of operations for the application of a set of reduction rules for the sequential compression of an input string with a known context and a previously know context-dependent grammar in accordance with an embodiment of the present invention.

FIG. 4 illustrates an exemplary method 400 of the application of a set of reduction rules that can sequentially construct a sequence of irreducible context-dependent grammars from which the original data sequence can be recovered incrementally. Extract the previous grammar reduction bit I (STEP 402). Define α as the last symbol of the production rule corresponding to the initial variable and the context pair $s_0|C_1$ in the previous irreducible context-dependent grammar (STEP 408). Define C as the context of α (STEP 410). Define β to be the last symbol of the production rule corresponding to the initial variable and context pair $s_0|C_1$ in the intermediate grammar $G'_{i+1}$ (STEP 412). Determine if αβ appears under the context C in two non-overlapping positions in $G'_{i-1}$ (STEP 414). If not, set the current irreducible grammar to be $G'_{i-1}$ (STEP 416) and set the current grammar bit I to 0 (STEP 418). If αβ does appear under the context C in two non-overlapping positions in $G'_{i-1}$, further determine if the previous grammar bit=1 (STEP 420).

If the previous grammar bit does not equal 1, further determine if αβ repeats itself under the same context in two non-overlapping positions in $G'_{i-1}(s_0|C_1)$ (STEP 422). If it does repeat, apply reduction rule 2 once to $G'_{i-1}$ (STEP 428), set the current irreducible context-dependent grammar to the resulting grammar (STEP 426), and set the current grammar bit I to 1 (STEP 428). If it does not repeat, apply reduction rule 3 once to $G'_{i-1}$ (STEP 430), set the current irreducible context-dependent grammar to the resulting grammar (STEP 426), and set the current grammar bit I to 1 (STEP 428).

Returning to the condition where the previous grammar bit does equal 1 (STEP 420), further determine if αβ repeats itself under the same context in two non-overlapping positions in $G'_{i-1}(s_0|C_1)$ (STEP 432). If it does repeat, apply reduction rule 2 followed by reduction rule 1 once to $G'_{i-1}$ (STEP 434), set the current irreducible context-dependent grammar to the resulting grammar (STEP 426), and set the current grammar bit I to 1 (STEP 428). If it does not repeat, apply reduction rule 3 followed by reduction rule 1 once to $G'_{i-1}$ (STEP 436), set the current irreducible context-dependent grammar to the resulting grammar (STEP 426), and set the current grammar bit I to 1 (STEP 428).

Figure 5:
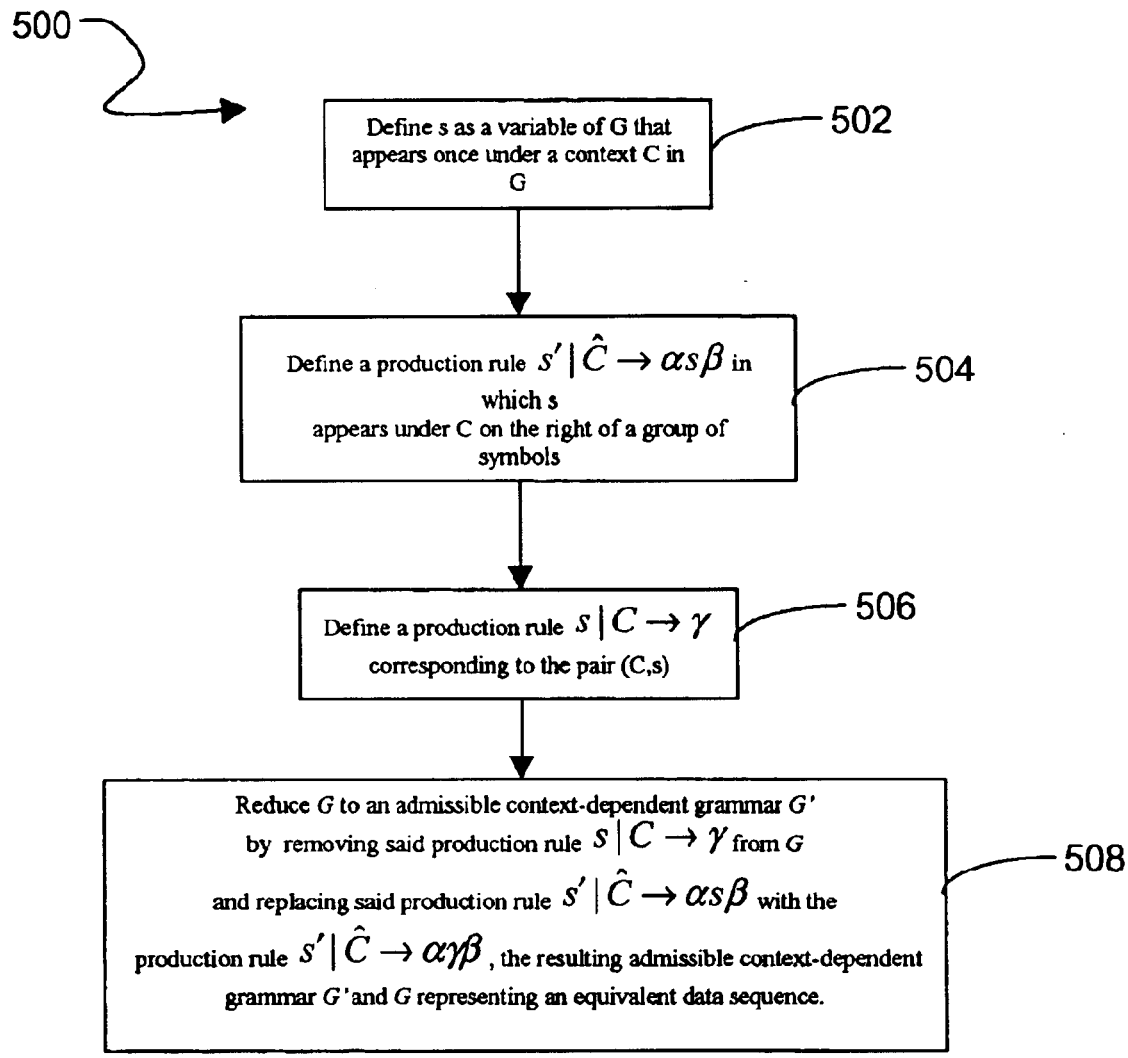
FIGS. 5, 6, 7, 8 and 9 are flow charts illustrating sequences of operations for reduction rules used to compress an input string with a known context and a previously know context-dependent grammar in accordance with an embodiment of the present invention.

FIG. 5 illustrates a method 500 for the application of reduction rule 1. Define s as a variable of an admissible context-dependent grammar G that appears only once under some context C in the range of G (STEP 502). Define a production rule $s'|\hat{C} \to \alpha s \beta$ in which s appears on the right under the context C (STEP 504). Define a production rule $s|C \to \gamma$ corresponding to the pair (C,s) (STEP 506). Reduce G to an admissible context dependent grammar G' by removing the production rule $s|C \to \gamma$ from G and replacing the production rule $s'|\hat{C} \to \alpha s \beta$ with the production rule $s'|\hat{C} \to \alpha \gamma \beta$. The resulting context-dependent grammar G' represents the same sequence as does G (STEP 508).

Figure 6:
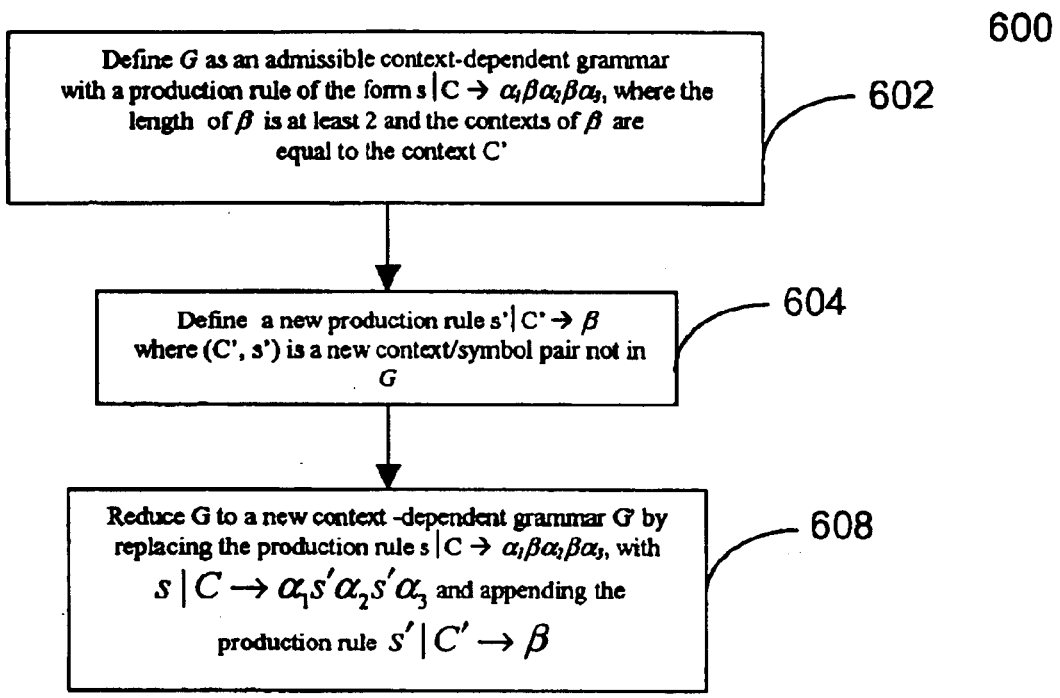

FIG. 6 illustrates a method 600 for the application of reduction rule 2. Define G as a context-dependent admissible grammar possessing a production rule of form $s|C \to \alpha_1 \beta \alpha_2 \beta \alpha_3$, where the length of β is at least 2 and the underlying contexts of β at these two locations are equal to the same context, C' (STEP 602). Define a new production rule $s'|C' \to \beta$, where (C',s') is a new pair of context and variable which is not in the domain of G (STEP 604). Reduce G to the new context-dependent grammar G' by replacing the production rule $s|C \to \alpha_1 \beta \alpha_2 \beta \alpha_3$ of G with $s|C \to \alpha_1 s' \alpha_2 s' \alpha_3$, and by appending the production rule $s'|C' \to \beta$, the resulting grammar G' includes a new pair of context and variable (C',s') and represents the same sequence x as does G (STEP 608).

Figure 7:
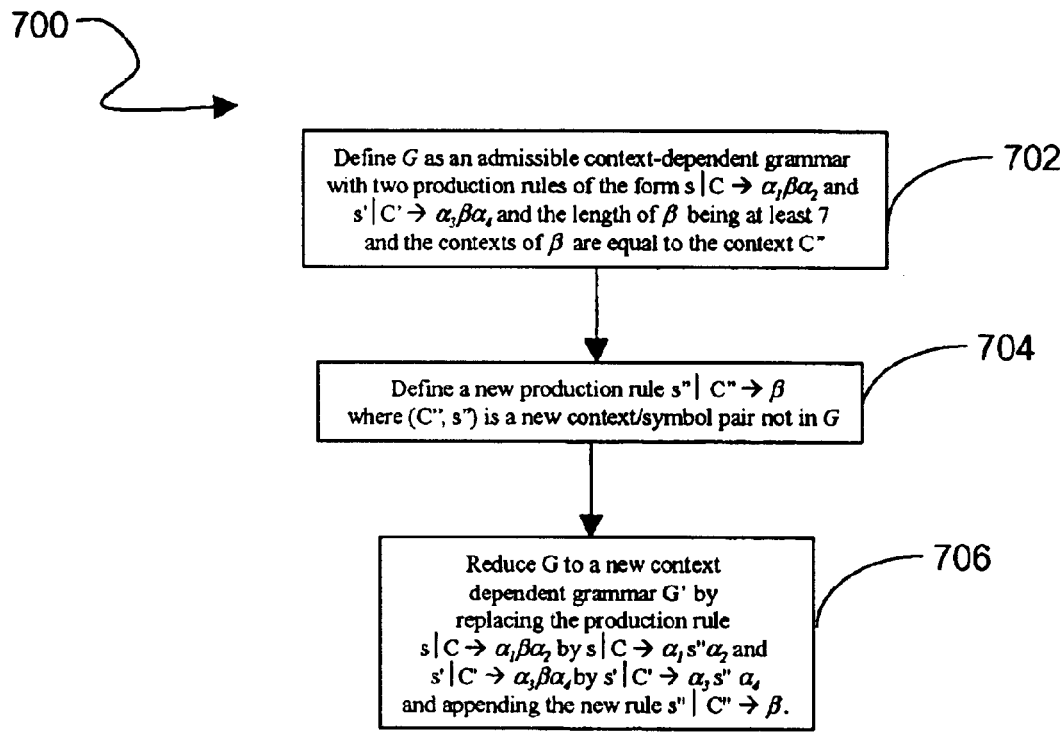

FIG. 7 illustrates a method 700 for the application of reduction rule 3. Define G as an admissible context-dependent grammar possessing two distinct production rules of form $s|C \to \alpha_1 \beta \alpha_2$ and $s'|C' \to \alpha_3 \beta \alpha_4$, where the length of β is at least 2, the underlying contexts of β at these two locations are equal to the same context, C''', either $\alpha_1$ or $\alpha_2$ is not empty, and either $\alpha_3$ or $\alpha_4$ is not empty (STEP 702). Define a new production rule $s''|C''' \to \beta$, where (C''',s'') is a new pair of context and variable which is not in the domain of G (STEP 704). Reduce G to a new context-dependent grammar G' by replacing the production rule $s|C \to \alpha_1 \beta \alpha_2$ by $s|C \to \alpha_1 s'' \alpha_2$, and by replacing the production rule $s'|C' \to \alpha_3 \beta \alpha_4$ by $s'|C' \to \alpha_3 s'' \alpha_4$, and by appending the new rule $s''|C''' \to \beta$ (STEP 706).

Figure 8:
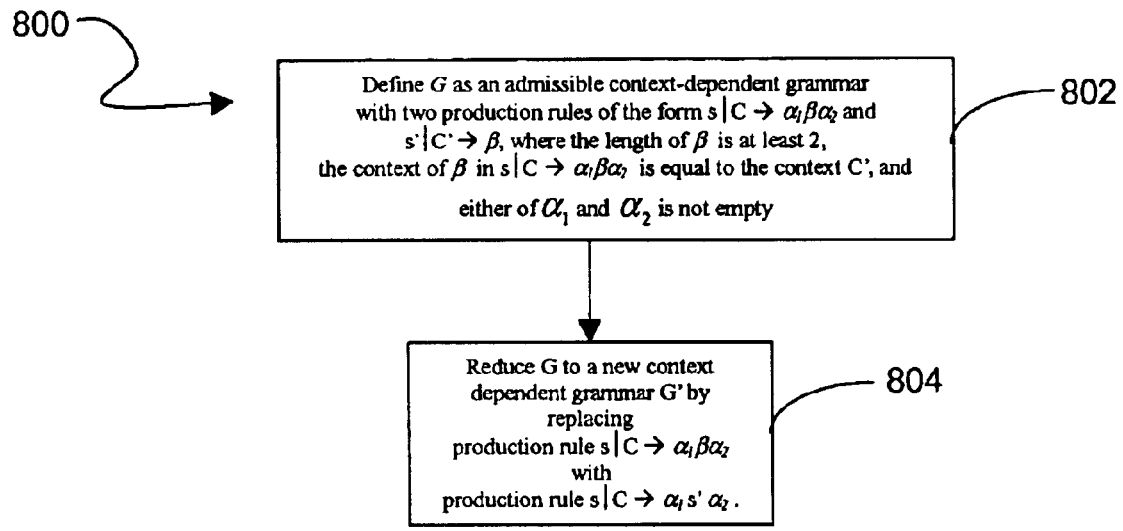

FIG. 8 illustrates a method 800 for the application of reduction rule 4. Define G as an admissible context-dependent grammar possessing two production rules of the form $s|C \to \alpha_1 \beta \alpha_2$ and $s'|C' \to \beta$, where the length of β is at least 2, the underlying context of β in $s|C \to \alpha_1 \beta \alpha_2$ is also equal to C', and either of $\alpha_1$ and $\alpha_2$ is not empty (STEP 802). Reduce G to the context-dependent grammar G' obtained by replacing said production rule $s|C \to \alpha_1 \beta \alpha_2$ with a new production rule $s|C \to \alpha_1 s' \alpha_2$ (STEP 804).

Figure 9:
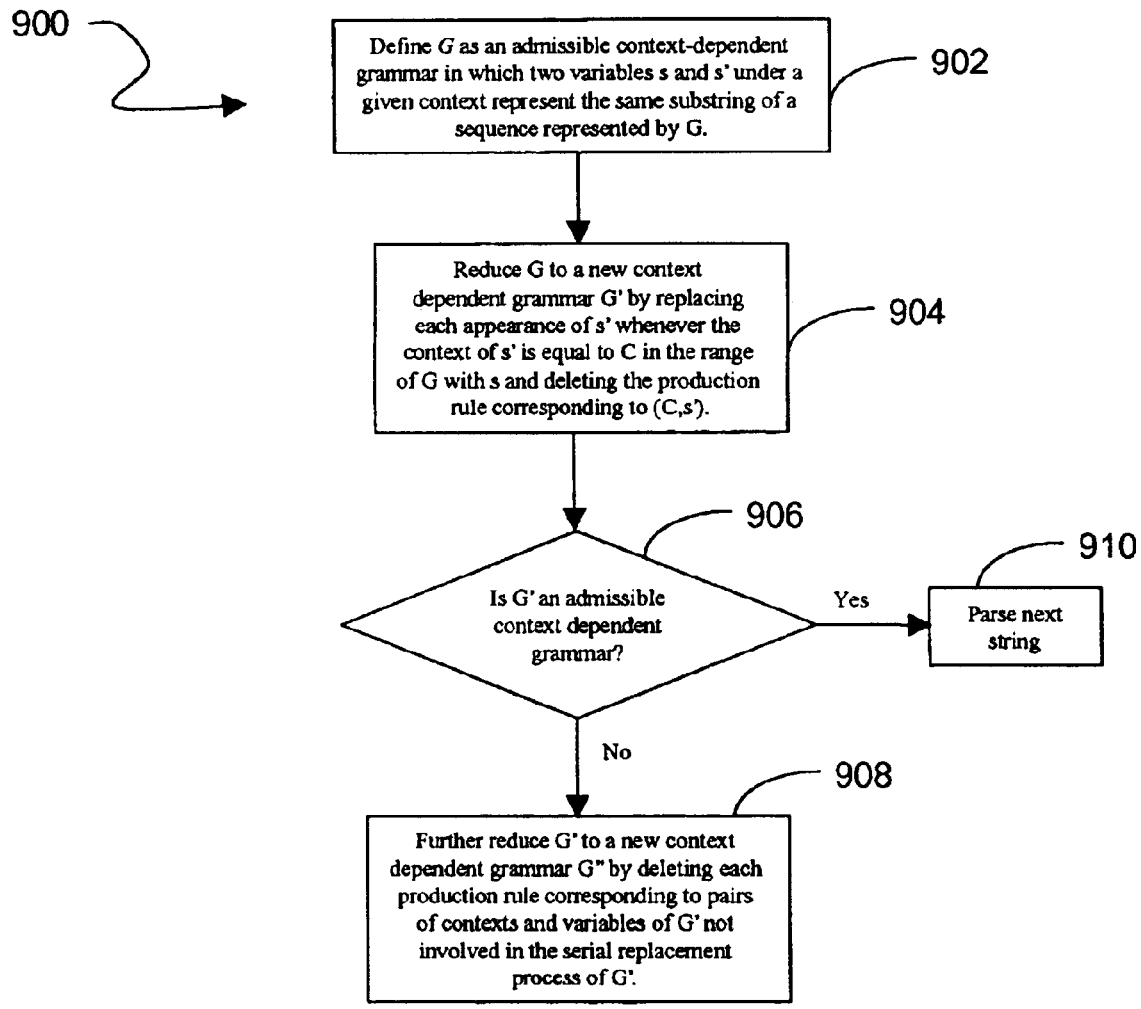

FIG. 9 illustrates a method 900 for the application of reduction rule 5. Define G as an admissible context-dependent grammar in which two variables s and s' under a given context C represent the same substring of an A-sequence represented by G (STEP 902). Reduce G to a new context-dependent grammar G' by replacing each appearance of s' whenever the underlying context of s' is equal to C in the range of G by s and deleting the production rule corresponding to (C,s') (STEP 904). Determine if the grammar G' is an admissible context-dependent grammar (STEP 906). The grammar G' may not be admissible because some G'-variables may not be involved in the serial replacement process of G'. If this is true, a further reduction of G' to the context-dependent grammar G'' can be achieved by deleting all production rules corresponding to variables of G' that were not involved in the serial reduction process (STEP 908), else parse the next string (STEP 910).

One aspect of the invention comprises a greedy context-dependent grammar transform that, in one embodiment, will compress $x = x_1, x_2, \ldots x_n$, a data sequence from A. The irreducible context-dependent grammar transform can be described as greedy, in that it parses the sequence x into non-overlapping substrings $\{x_1, x_2 \ldots x_{n_1}, \ldots, x_{n_{t-1}+1} \ldots x_{n_t}\}$ and sequentially builds an irreducible context-dependent grammar for each $x_1 \ldots x_{n_i}$, where $1 \leq i \leq t$, $n_1 = 1$ and $n_t = n$. In this case, the first substring $x_1$ and the corresponding irreducible context-dependent grammar $G_1$ consists of only one production rule $s_0|C_1 \to x_1$, where $C_1$ is the initial context. Suppose that $x_1, x_2 \ldots x_{n_i}, \ldots, x_{n_{i-1}+1} \ldots x_{n_i}$ have been parsed and the corresponding irreducible context-dependent grammar $G_i$ for $x_1 \ldots x_{n_i}$ has been built. Suppose that the variable set of $G_i$ is $S(j_i) = \{s_0, s_1, \ldots s_{j_i-1}\}$, where $j_i = 1$ and the domain of $G_i$ is $\Omega_G(K_i, j_i)$. Let $C_{n_i+1}$ be the context for $x_{n_i+1}$ generated by the countable context model. The next substring $x_{n_i+1} \ldots x_{n_{i+1}}$ is the longest prefix of $x_{n_i+1} \ldots x_n$ that can be represented by some $s_j \in \{s : (C_{n_i+1}, s) \in \Omega_G(K_i, j_i)\}$ under the context $C_{n_i+1}$ if such a prefix exists. Otherwise, $x_{n_i+1} \ldots x_{n_{i+1}} = x_{n_{i+1}}$ with $n_{i+1} = n_i + 1$. If $n_{i+1} - n_i > 1$ and $x_{n_i+1} \ldots x_{n_{i+1}}$ is represented by $s_j$ under the context $C_{n_i+1}$, then append $s_j$ to the right end of $G_i(s_0|C_1)$; otherwise, append the symbol $x_{n_i+1}$ to the right end of $G_i(s_0|C_1)$. The resulting context-dependent grammar is admissible, but not necessarily irreducible. Applying reduction rules 1 through 5 reduces the context-dependent grammar to an irreducible context-dependent grammar $G_{i+1}$. Once reduced, $G_{i+1}$ then represents the sequence $x_1 \ldots x_{n_{i+1}}$. Repeating the process until the entire sequence x is processed results in a final irreducible context-dependent grammar $G_t$, which represents the sequence x.

EXAMPLE 2

The following example illustrates the method described above. Define A = {0,1} and x = 000100111100001111001111. Apply the above described irreducible context-dependent grammar transform to x using a countable context model C = {0, 1}, and the next context function $f$ as $C_{i+1} = x_i$. The first three parsed substrings are 0, 0 and 0. Assuming the initial context $C_1 = 0$, the corresponding irreducible context-dependent grammars $G_1$, $G_2$, and $G_3$ are given by $\{s_0|0 \to 0\}$, $\{s_0|0 \to 00\}$, and $\{s_0|0 \to 000\}$, respectively. Since $j_3 = 1$, the fourth parsed substring is $x_4 = 1$. Appending the symbol 1 to the end of $G_3(s_0|0)$ results in an admissible context-dependent grammar $G'_3$ given by $\{s_0|0 \to 0001\}$. $G'_3$ itself is irreducible, so none of the reduction rules can be applied and $G_4$ is equal to $G'_3$.

Continuing with the above Example 2, the fifth and sixth parsed phrases are $x_5 = 0$ and $x_6 = 0$, respectively. $G_6$ is given by $\{s_0|0 \to 000100\}$. The seventh parsed phrase is $x_7 = 1$. Appending the symbol 1 to the end of $G_6(s_0|0)$, the resulting admissible context-dependent grammar $G'_6$ is given by $s_0|0 \to 0001001$. $G'_7$ is not irreducible because there is a non-overlapping repeated pattern 01 under the same context 0 in the range of $G'_6$. Applying reduction rule 2 one time, we get an irreducible context-dependent grammar $G_7$ given by $s_0|0 \to 00s_1 0s_1$ $s_1|0 \to 01.$ Based on $G_7$, the next five parsed phrases are $x_8=1$, $x_9=1$, $x_{10}=1$, $x_{11}=0$, and $x_{12}=0$, respectively. Appending the parsed phrases to the end of $G_7(s_0|0)$ successively results in the irreducible context-dependent grammars $G_9$ through $G_{12}$. The thirteenth parsed phrase is $x_{13}=0$. Appending the symbol 0 to the end of $G_{12}(s_0|0)$ and applying reduction rule 2 once results in the following irreducible context-dependent grammar $G_{13}$:

$s_0|0 \to s_2 s_1 0 s_1 1110 s_2$ $s_1|0 \to 01$ $s_2|0 \to 00$ with a remaining, unparsed string of 01111001111 under the current context of 0. In this example, since the sequence from A represented by $s_1$ under the context 0 matches the prefix of the remaining portion of x under the same context 0, the next parsed phrase is $x_{14}, x_{15}=01$. Appending the symbol $s_1$ to the end of $G_{13}(s_0|0)$ results in an admissible context-dependent grammar $G'_{13}$ given by:

$s_0|0 \to s_2 s_1 0 s_1 1110 s_2 s_1$ $s_1|0 \to 01$ $s_2|0 \to 00$

Because $s_2 s_1$ is repeated under the context 0, $G'_{13}$ is not irreducible. The application of reduction rule 2 results in an irreducible context-dependent grammar $G''_{13}$ given by:

$s_0|0 \to s_3 0 s_1 1110 s_3$ $s_1|0 \to 01$ $s_2|0 \to 00$ $s_3|0 \to s_2 s_1$

In the above grammar, the variable $s_2$ appears only once, under the context 0 in the range of $G''_{13}$ therefore applying reduction rule 1 once results in an irreducible context-dependent grammar $G_{14}$ given by:

$s_0|0 \to s_2 0 s_1 1110 s_2$ $s_1|0 \to 01$ $s_2|0 \to 00 s_1.$

Continuing with this method produces the final irreducible context-dependent grammar $G_{22}$ given by:

$s_0|0 \to s_2 0 s_1 s_1 s_2 s_1 s_1 s_2$ $s_1|0 \to 01$ $s_1|1 \to s_2 0$ $s_2|0 \to 00 s_1$ $s_2|1 \to 111.$

As a result, the irreducible context-dependent grammar transform parses x into:

{0,0,0,1,0,0,1,1,1,1,0,0,0,01,1,1,1,0,01,1,1,1}

Figure 10:
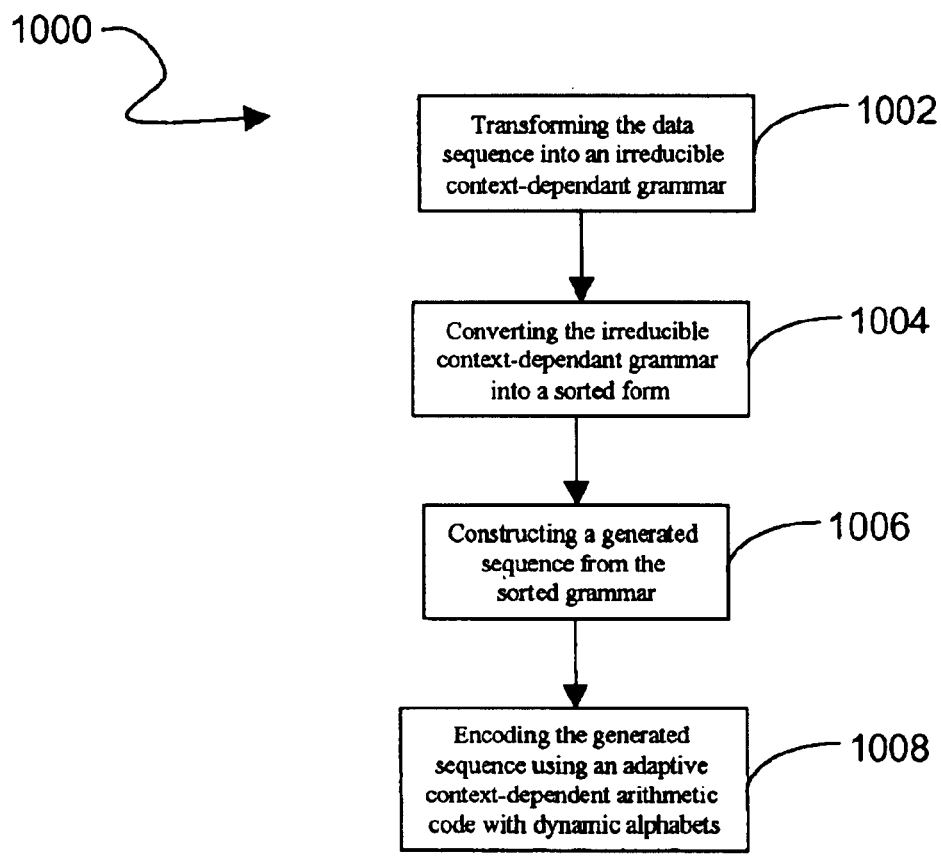
FIG. 10 is a flow chart illustrating a hierarchical method of encoding a generated sequence in accordance with an embodiment of the present invention.

Another aspect of the invention, referred to as 1000, is illustrated in FIG. 10, and referred to herein as the "hierarchical context-dependent method." This method comprises a greedy irreducible context-dependent transform followed by the context-dependent arithmetic coding of the final irreducible context-dependent grammar $G_t$. A data sequence is first transformed into an irreducible context-dependent grammar (STEP 1002), then converted into its sorted form (STEP 1004). A generated sequence is constructed from the sorted grammar (STEP 1006) and encoded using an adaptive context-dependent arithmetic code with dynamic alphabets (STEP 1008).

As an illustration, let $\chi$ be an A-sequence that is to be compressed. Let $G_t$ be the final irreducible context-dependent grammar representing $\chi$ furnished by our irreducible context-dependent grammar transform. In the hierarchical context-dependent method, a context-dependent arithmetic code with a dynamic alphabet is used to encode $G_t$ (or its equivalent form). After receiving the binary codeword, the decoder recovers $G_t$ (or its equivalent form) and then performs the serial replacement procedure illustrated in Example 1 to get $\chi$.

One embodiment illustrates first how an admissible context-dependent grammar G induces a partition of the sequence $\chi \in A^n$, and then further describes the concept of sorted context-dependent grammars. Let $\Omega_G$ denote a dynamically changing subset of $\Omega_G(K,j)$; initially, $\Omega_G$ is empty. Let $u^{(0)} = G(s_0|C_1)$; where $u^{(0)}$ is a sequence from $(S(j) \cup A)$. If $j=1$, or equivalently if there is no variable in $u^{(0)}$, then $u^{(0)}$ itself refers to the partition sequence induced by G. Otherwise, perform the following steps:

Step 1: Set $i=0$;

Step 2: For $i \geq 0$, read $u^{(i)}$ from left to right. Replace the first pair (C,s) which is not in $\Omega_G$ by G(s|C), where C is the context for s determined by the context model, the resulting sequence being denoted by $u^{(i+1)}$;

Step 3: Update $\Omega_G$ by inserting the pair (C,s) into $\Omega_G$;

Step 4: Repeat Steps 2 and 3 for $i=0,1,\ldots,|\Omega_G(K,j)|-1$ so that each pair $(C,s) \in \Omega_G(K,j) \setminus \{(C_1,s_0)\}$ is replaced by G(s|C) exactly once.

The final sequence $u^{(|\Omega_G(K,j)|-1)}$ is called the partition sequence induced by G. A context-dependent grammar G is said to be of sorted form if in the above procedure, the dynamic set $\Omega_G$ is augmented in such a way that for every context C appearing in $\Omega_G(K,j)$, $(C,s_i)$ appears before $(C,s_{i+1})$ for any meaningful $i>0$.

In $G_{22}$ shown in Example 2, $|\Omega_G(K,j)|=5$. The five sequences $u^{(0)}, \ldots, u^{(4)}$ are $u^{(0)} = s_2 0 s_1 s_1 s_2 s_1 s_1 s_2,$ $u^{(1)} = 00 s_1 0 s_1 s_1 s_2 s_1 s_1 s_2,$ $u^{(2)} = 00010 s_1 s_1 s_2 s_1 s_1 s_2,$ $u^{(3)} = 00010 s_1 s_2 0 s_2 s_1 s_1 s_2,$ and $u^{(4)} = 00010 s_1 1110 s_2 s_1 s_1 s_2.$ The partition sequence $u^{(4)}$ parses the sequence x into 0,0,0,1,0,01,1,1,0,0001,1110,01,111.

The concatenation of the above substrings reproduces the original sequence x. The dynamic set $\Omega_G$ is augmented in the order of $(0,s_2)$, $(0,s_1)$, $(1,s_1)$, and $(1,s_2)$. Therefore, in this example, $G_{22}$ is not sorted form.

The hierarchical context-dependent method can now be used to encode the sequence, and is illustrated using Example 2. As demonstrated above, the final irreducible context-dependent grammar $G_{22}$ is not of sorted form. Convert $G_{22}$ into its sorted form $G_{22}^s$ given by $$s_0|0 \to s_1 0 s_2 s_1 s_1 s_1 s_2 s_2$$

$$s_1|0 \to 00 s_2$$

$$s_1|1 \to s_2 0$$

$$s_2|0 \to 01$$

$$s_2|1 \to 111.$$

In view of Example 2, to obtain $G_{22}^s$ from $G_{22}$, variables $s_1, s_2$ can be renamed under the context 0 in $G_{22}$ as $s_2, s_1$ under the context 0 in $G_{22}^s$, respectively. Note that both $G_{22}$ and $G_{22}^s$ represent the same sequence x. $G_{22}^s$ is now encoded and transmitted instead of $G_{22}$. Apply the procedure specified in steps 1–4 above to $G_{22}^s$. The result is the partition sequence induced by $G_{22}^s$:

$$u^{(4)} = 00010 s_2 1110 s_1 s_1 s_2 s_2$$

Let $\alpha$ be the last symbol of $G_i(s_0|C_1)$ and $\hat{C}$ be the context for $\alpha$. To address the fact that $G_{22}^s$ cannot be recovered from the partition sequence, the procedure is modified slightly. Particularly, in Step 2, [G(s|C)] is substituted for the first variable s and its context C which are not in $\Omega_G$ as a pair, and the corresponding sequences are denote by $^{(i)}, i=0, \ldots, |\Omega_G(K,j)|-1$. Applying the modified procedure to $G_{22}^s$, results in the following sequence from $((S(j) \cup A) \cup \{[,]\})$ $$u^{(4)} = [00[01]]0 s_2 [[111]0] s_1 s_1 s_2 s_2$$

which will be called the sequence generated from $G_{22}$ or its sorted form $G_{22}^s$. Because of the introduction of symbols [ and ], the next context function $f$ of the associated countable-context model is modified slightly so that C=$f$(C, [), and C=$f$(C,]) for every C∈C, i.e. [ and ] simply relay contexts. Therefore, $G_{22}^s$ and the sequence x can be recovered from the sequence $\tilde{u}^{(4)}$ generated from $G_{22}^s$. The number of legitimate pairs of brackets [ and ] in $\tilde{u}^{(4)}$ is equal to the number of pairs of variable and contexts in the domain of $G_{22}^s$ except $(C_1, s_0)$; the content inside the ith legitimate pair of brackets [ and ] under a context C gives rise to the production rule corresponding to $s_i|C$. Therefore it is possible to infer from $\tilde{u}^{(4)}$ what each variable $s_i$ represents under a given context, and therefore use the sorted CDG $G_{22_s}$ rather than the original CDG $G_{22}^s$. To compress $G_{22}^s$ or the sequence x, a context-dependent arithmetic code with dynamic alphabets is used to encode the sequence generated from $G_{22}^s$. Note that both the encoder and the decoder know the associated countable-context model. Each pair $(C, \beta) \in (C \times S) \cup (C \times (A \cup \{[,]\}))$ is associated with a counter $c(C, \beta)$, which is set to 1 if $(C, \beta) \in C \times (A \cup \{[,]\})$ and set to 0 otherwise. Encode each symbol $\beta$ in the sequence generated from $G_{22}^s$ and update the related counters according to the following steps:

Step 1: Encode $\beta$ conditioned on the context C(C=$C_1$ initially) by using the probability $$c(C, \beta) / \sum c(C, \alpha)$$

where the summation $$\sum_\alpha$$

is taken over symbols $\alpha \in S \cup A \cup \{[,]\}$ such that $c(C, \alpha) \neq 0$.

Step 2: Increase $c(C, \beta)$ by 1.

Step 3: If $\beta =$ ] and the legitimate bracket pair corresponding to $\beta$ is the ith bracket pair under the context C', which is the context for [ of this bracket pair, in the sequence generated from G, increase the counter $c(C', s_i)$ from 0 to 1.

Step 4: Determine the next context C for the next phrase in the generated sequence.

Repeat the above procedure until the entire generated sequence is encoded. For the generated sequence $\tilde{u}^{(4)}$ shown above, the product of the probabilities used in the arithmetic coding process is $$\frac{1}{4} \frac{1}{5} \frac{2}{6} \frac{2}{7} \frac{3}{8} \frac{1}{9} \frac{1}{4} \frac{2}{5} \frac{1}{6} \frac{1}{12} \frac{1}{7} \frac{2}{8} \frac{1}{9} \frac{2}{10} \frac{3}{11} \frac{3}{12} \frac{2}{14} \frac{1}{13} \frac{1}{14} \frac{1}{16} \frac{2}{15} \frac{1}{17}.$$

In general, to encode the final irreducible CDG $G_t$, it is first converted into its sorted form $G_t^s$, then the sequence generated from $G_t$ is constructed, and finally a context-dependent arithmetic code with dynamic alphabets is used to encode the generated sequence.

Figure 11:
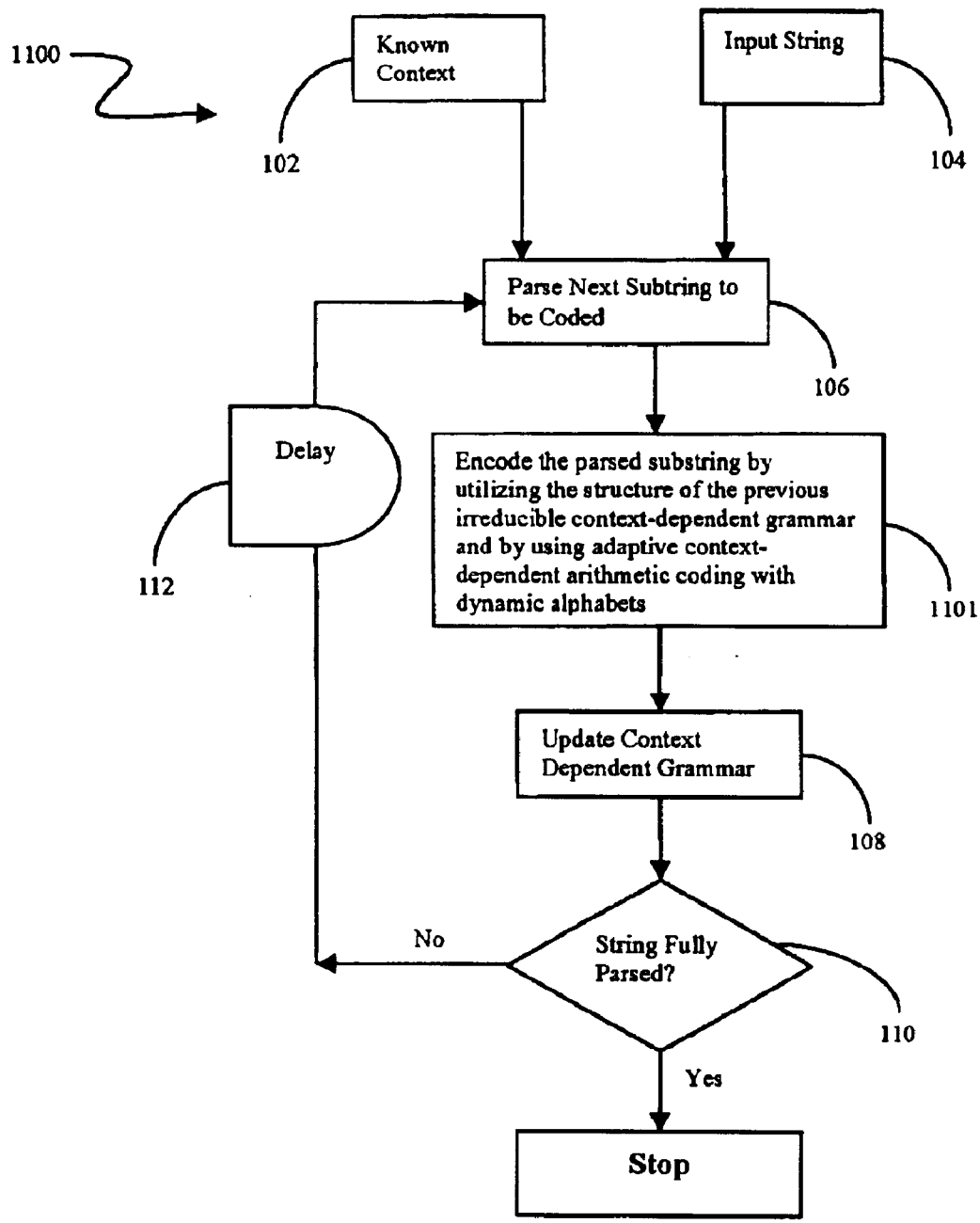
FIG. 11 is a flow chart illustrating the encoding of an input string with a known context using one embodiment of a sequential context-dependent method.

FIG. 11 illustrates yet another aspect of the invention, a method 1100, referred to herein as the "sequential context-dependent method," comprising using a context-dependent arithmetic code with dynamic alphabets to encode the sequence of parsed phrases $x_1, x_2 \ldots x_{n_2}, \ldots, x_{n_{i-1}+1} \ldots x_{n_i}$. The known context 102 and input string 104 serve as input and parsed into non-overlapping strings (STEP 106). Each parsed substring is encoded using the structure of the previous irreducible context-dependent grammar and by using adaptive context-dependent arithmetic coding with dynamic alphabets (STEP 1101). A context-dependent grammar is generated and updated (STEP 108) until the string is fully parsed (STEP 110).

As in the hierarchical context-dependent method, each pair $(C, \beta) \in (C \times S) \cup (C \times A)$ is associated with a counter $c(C, \beta)$, which is set initially to 1 if $(C, \beta) \in C \times A$ and to 0 otherwise. Each phrase is encoded conditionally given its context. Assume that $x_1, x_2 \ldots x_{n_2}, \ldots, x_{n_{i-1}+1} \ldots x_{n_i}$ have been encoded and all corresponding counters have been updated. Assume further that $G_i$ is the corresponding irreducible context-dependent grammar for $x_1, \ldots x_{n_i}$ and that the variable set of $G_i$ is equal to $S(j_i) = \{s_0, s_1, \ldots, s_{j-1}\}$. Parse $x_{n_i+1} \ldots x_{n_{i+1}}$ using the greedy context-dependent grammar transform and represent the parsed string by $\beta \in \{s_1, \ldots, s_{j-1}\} \cup A$. Encode $\beta$ and update related counters according to the following steps:

Step 1: Determine the context C for $\beta$.

Step 2: Encode $\beta$ conditionally given the context C by using the probability $$c(C, \beta) / \sum c(C, \alpha)$$

where the summation $$\sum_\alpha$$

is taken over all symbols $\alpha \in S(j_i) \cup A$ such that $c(C,\alpha) \neq 0$.

Step 3: Increase $c(C,\beta)$ by 1.

Step 4: Get $G_{i+1}$ from the appended $G_i$.

Step 5: If $G_{i+1}$ introduces a new production rule corresponding to a new pair (C',s), increase the counter c(C',s) from 0 to 1.

Repeat the above procedure for all parsed phrases until the entire sequence is processed and encoded.

Another aspect of the invention, referred to herein as the "improved sequential context-dependent method" comprises using an order 1 arithmetic code to encode the sequence $\{I(i)\}'_{i=1}$, and using the sequence $\{I(i)\}'_{i=1}$ and the structures of $\{G_i\}'_{i=1}$ to improve the encoding of the sequence of parsed phrases $x_1, x_2 \ldots x_{n2}, \ldots, x_{n_{i-1}+1} \ldots x_{n_i}$. In addition to the counters $c(C,\gamma),(C,\gamma) \in C \times (S \cup A)$ defined above, define counters $c_f(0,0)$, $c_f(0,1)$, $c_f(1,0)$, $c_f(1,1)$ and $\hat{c}(C,\gamma)$. The counters $c_f(0,0)$, $c_f(0,1)$, $c_f(1,0)$, and $c_f(1,1)$ are used to encode the sequence $\{I(i)\}'_{i=1}$ and are all initially set equal to 1. The $(i+1)^{th}$ parsed phrase is encoded by the counters $\hat{c}(C,\gamma)$ whenever $I(i)=0$ and $I(i+1)=1$ and by the counters $c(C,\gamma)$ whenever $I(i+1)=0$. Similar to $c(C,\gamma)$, initially set $\hat{c}(C,\gamma)=1$ if $(C,\gamma) \in C \times A$ and set it to 0 otherwise. The first three parsed phrases $x_1$, $x_2$, and $x_3$ are encoded as in the sequential context-dependent method. Also, because I(1), I(2) and I(3) are all 0, there is no need to encode them. Starting with the fourth phrase, $I(i+1)$ is encoded first, and then used with the structure of $G_i$ as additional context information to encode the $(i+1)^{th}$ parsed phrase.

As a further illustration, assume that $x_1, x_2 \ldots x_{n2}, \ldots, x_{n_{i-1}+1} \ldots x_{n_i}$ and $I(4), \ldots, I(i)$ have been encoded and that all corresponding counters have been updated. Assume further that $G_i$ is the corresponding irreducible context-dependent grammar for $x_1, \ldots x_{n_i}$ and that the variable set of $G_i$ is equal to $S(j_i)=\{s_0,s_1,\ldots,s_{j-1}\}$. With the domain of $G_i$ being $\Omega_G(K_i,j_i)$, let j(c,i) be the number of variables except $s_0$ associated with any C in $\Omega_G(K_i,j_i)$. In addition, let $\alpha$ be the last symbol of $G_i(s_0|C_1)$ and $\hat{C}$ be the context for $\alpha$. Parse $x_{n_i+1} \ldots x_{n_{i+1}}$ using the greedy context-dependent grammar transform and represent the parsed string by $\beta \in \{s_1, \ldots, s_{j-1}\} \cup A$. Encode $I(i+1)$ and $\beta$ and update the relevant counters using the following steps:

Step 1: Encode $I(i+1)$ using the probability $$c_1(I(i),I(i+1))/(c_i(I(i),0)+c_i(I(i),1))$$

Step 2: Increase $c_1(I(i),I(i+1))$ by 1

Step 3: Determine the context $\hat{C}$ for $\beta$.

Step 4: If $I(i+1)=0$, encode $\beta$ conditioned on $\hat{C}$ by using the probability $$c(\tilde{C},\beta)\Big/\sum_\gamma c(\tilde{C},\gamma),$$

where the summation $$\sum_\gamma$$

is taken over all symbols $\gamma \in S(j_i) \cup A - L_2(\alpha|\hat{C})$ such that $c(\tilde{C},\gamma) \neq 0$, and then increase $c(\tilde{C},\beta)$ by 1. Otherwise, if $I(i)=0$ and $I(i+1)=1$, encode $\beta$ conditioned on $\tilde{C}$ by using the probability:

$$c(\tilde{C},\beta)\Big/\sum_{\gamma \in L_1(\alpha|\hat{C})} c(\tilde{C},\gamma),$$

and then increase $c(\tilde{C},\beta)$ by 1. Conversely, if $I(i)=1$ and $I(i+1)=1$, no information is sent because $L_1(\alpha|\hat{C})$ contains only one element and the decoder knows what $\beta$ is. Here said list $L_1(\alpha|\hat{C})$ comprises all symbols $\gamma \in S(j_i) \cup A$ having the following properties:

a). the pattern $\alpha\gamma$ appears under the context $\hat{C}$ in the range of $G_i$;

b). the pattern $\alpha\gamma$ under the context $\hat{C}$ is not the two symbols of $G_i(s_0|C_1)$; and c). there is no variable $s_j$ of $G_i$ such that $G_i(s_j|\hat{C})$ is equal to $\alpha\gamma$; and d). said list $L_2(\alpha|\hat{C})$ comprises all symbols $\gamma \in S(j_i) \cup A$ having the following properties a) and b).

Step 5: Get $G_{i+1}$ from the appended $G_i$. Update all lists $L_1(\gamma|C)$ and $L_2(\gamma|C)$ accordingly.

Step 6: If $j_{(\hat{C}_j+1)} > j_{(\hat{C}_j)}$, this implies that $G_{i+1}$ has introduced a new production rule corresponding to $s_{j(\hat{C}_j)+1}|C$, and therefore both $c(\hat{C},s_{j(\hat{C}_j)+1})$ and $\hat{c}(\hat{C},s_{j(\hat{C}_j)+1})$ are increased by 1.

Repeat this process until the entire sequence x is processed and encoded.

EXAMPLE 3

Applying the improved sequential context-dependent method described above to compress the sequence x from Example 2 where the sequence was parsed into $$\{0,0,0,1,0,0,1,1,1,0,0,0,01,1,1,1,0,01,1,1,1\},$$

the corresponding sequence $\{I(i)\}$ is $\{00000010000001101110011\}$. The product of the probabilities used to encode the sequence $\{I(i)\}_{i=4}^{22}$ is $$\frac{1}{2}\frac{2}{3}\frac{3}{4}\frac{1}{5}\frac{1}{2}\frac{4}{6}\frac{5}{7}\frac{6}{8}\frac{7}{9}\frac{2}{10}\frac{1}{3}\frac{2}{4}\frac{3}{11}\frac{2}{5}\frac{3}{6}\frac{3}{7}\frac{8}{12}\frac{4}{13}\frac{4}{8}.$$

The product of the probabilities used to encode the parsed phrases is $$\frac{1}{2}\frac{2}{3}\frac{3}{4}\frac{1}{1}\frac{1}{2}\frac{4}{6}\frac{1}{2}\frac{1}{1}\frac{2}{4}\frac{3}{5}\frac{2}{2}\frac{5}{7}\frac{1}{2}\frac{4}{4}\frac{1}{2}\frac{1}{9}\frac{5}{8}\frac{2}{3}.$$

For embodiments in which the invention is provided as a software program, the program may be written in any one of a number of high level languages such as FORTRAN, PASCAL, JAVA, C, C++, C#, or BASIC. Additionally, the software could be implemented in an assembly language directed to the microprocessor resident on the target computer, for example, the software could be implemented in Intel 80x86 assembly language if it were configured to run on an IBM PC or PC clone. The software may be embodied on an article of manufacture including, but not limited to, a floppy disk, a hard disk, an optical disk, a magnetic tape, a PROM, an EPROM, EEPROM, field-programmable gate array, or CD-ROM.

In these embodiments, the software may be configured to run on any personal-type computer or workstation such as a PC or PC-compatible machine, an Apple Macintosh, a Sun workstation, etc. In general, any device could be used as long as it is able to perform all of the functions and capabilities described herein. The particular type of computer or workstation is not central to the invention.

Figure 12:
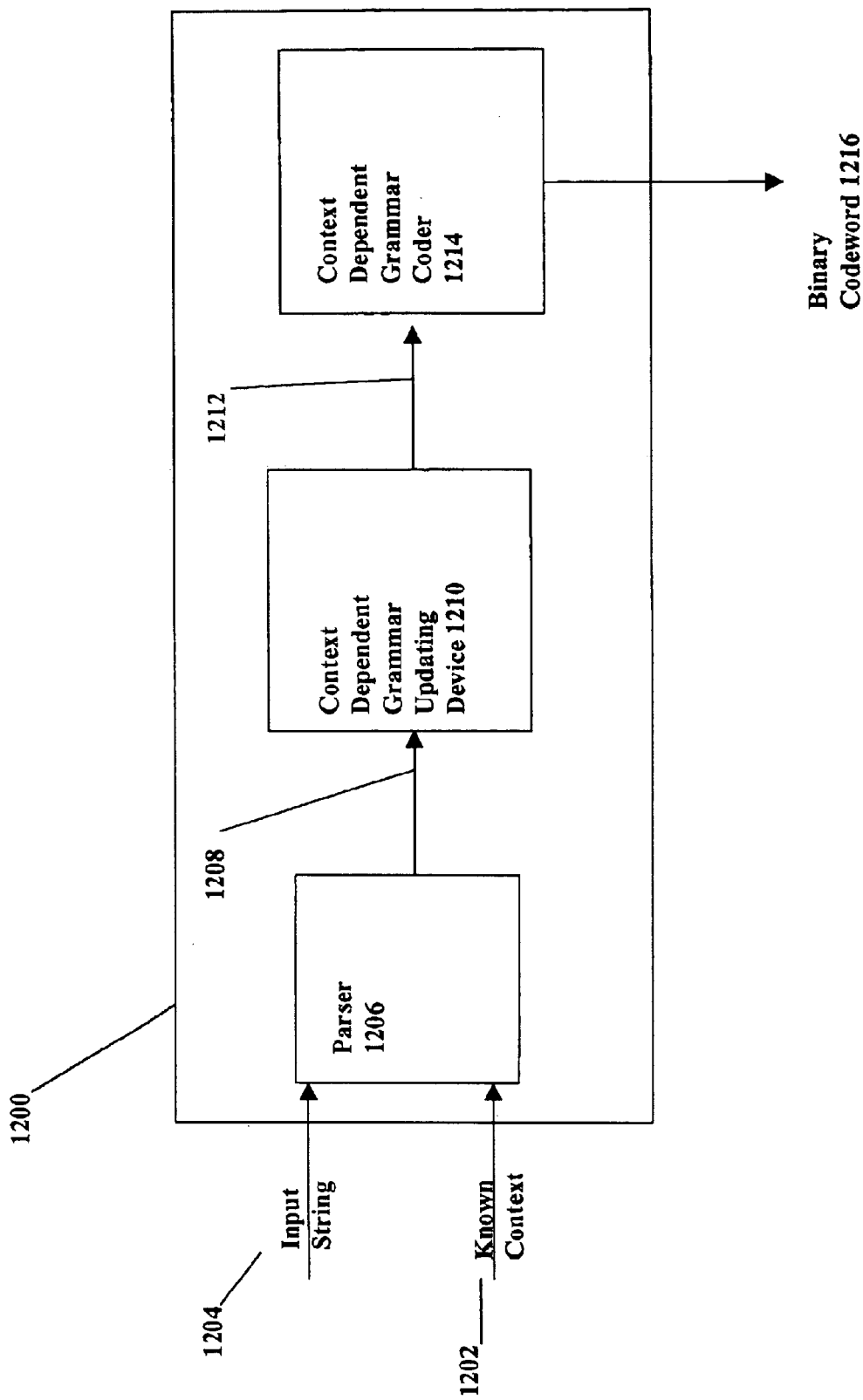
FIG. 12 is a block diagram of illustrating an apparatus for data compression using a context-dependent grammar transform method in accordance with an embodiment of the present invention.

FIG. 12 illustrates one embodiment in which the invention is provided as an apparatus 1200 for performing the methods described above. The apparatus 1200 consists of a parser 1206, a context-dependent grammar updating device, 1210, and a context-dependent grammar coder, 1214. The parser 1206 accepts as input an input string 1204 and a known context 1202 and parses the input string 1204 into a series of non-overlapping substrings, 1208. The parser causes the transmission of the substrings 1208 to the context-dependent grammar updating device 1210, which in turn produces an updated context-dependent grammar G. The context-dependent grammar updating device 1210 transmits the updated grammar G to the context-dependent grammar coder 1214 which then encodes the grammar G into a compressed binary codeword 1216.

For example, the apparatus 1200 may be provided as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the apparatus 1200 may be implemented using one or more microprocessors such as the Pentium family or chips manufactured by Intel Corporation of Santa Clara, Calif. or the PowerPC family of chips manufactured by Motorola Corporation of Schaumburg, Ill.

While the invention has been particularly shown and described with reference to specific preferred embodiments, it should be understood by those skilled in the art that various changes in form and detail can be made therein without departing from the spirit and scope of the invention as defined by the appended claims.

What is claimed is:

1. A method of sequentially transforming an original data sequence comprising a plurality of symbols and associated with a known context model into an irreducible context-dependant grammar from which the original data can be fully recovered, wherein the irreducible context-dependent grammar is represented by a set of production rules which are formed using a set of pairs of variables and contexts representing non-overlapping repeated patterns and contexts in the data sequence, the method applicable to any countable context model and comprising the steps of:

(a) parsing a substring from the sequence, wherein the substring is the longest prefix of a string of previously unparsed symbols of the sequence that can be represented, under the context of the current time instant, by a variable within the set of variables of a previous irreducible context-dependent grammar other than the initial variable in the initial pair of the set of pairs of variables and contexts if such a prefix exists, and otherwise a first symbol of the string of the previously unparsed symbols in the sequence;

(b) generating an admissible context-dependent grammar based on the substring, the current context, and the previous irreducible context-dependent grammar;

(c) applying at least one set of reduction rules to the admissible context-dependent grammar to generate a new irreducible context-dependent grammar;

(d) repeating steps (a) through (c) until all of the symbols of the sequence are represented by the final irreducible context-dependent grammar.

2. The method according to claim 1, wherein said applying step further comprises the step of implementing a reduction rule comprising the steps of:

(a) defining s as a variable of an admissible context-dependent grammar G that appears once under some context C in the range of G;

(b) defining a production rule $s'|\hat{C} \to \alpha s \beta$ in which s appears under the context C on the right of a group of symbols;

(c) defining a production rule $s|C \to \gamma$ which corresponds to the pair (C,s); and (d) reducing G to an admissible context-dependent grammar G' by removing said production rule $s|C \to \gamma$ from G and replacing said production rule $s'|\hat{C} \to \alpha s \beta$ with the production rule $s'|\hat{C} \to \alpha \gamma \beta$, the resulting admissible context-dependent grammar G' and G representing an equivalent data sequence.

3. The method according to claim 1, wherein said applying step further comprises the step of implementing a reduction rule comprising the steps of:

(a) defining G as an admissible context-dependent grammar possessing a production rule of form $s|C \to \alpha_1 \beta \alpha_2 \beta \alpha_3$, where the length of β is at least 2, and the underlying contexts of β at these two locations are equal to the same context C';

(b) defining a new production rule $s'|C' \to \beta$, where (C',s') is a new pair of context and variable which is not in the domain of G; and (c) reducing G to a new context-dependent grammar G' by replacing the production rule $s|C \to \alpha_1 \beta \alpha_2 \beta \alpha_3$ of G with $s|C \to \alpha_1 s' \alpha_2 s' \alpha_3$, and appending the production rule $s'|C' \to \beta$, the resulting grammar G' having a new pair of context and variable (C',s') and representing an equivalent data sequence x as does G.

4. The method according to claim 3, wherein said reducing step is performed in lieu of other ones of said set of production rules when G' has a non-overlapping repeated pattern of said symbols and contexts in the range of G'.

5. The method according to claim 1, wherein said applying step further comprises the step of implementing a reduction rule comprising the steps of:

(a) defining G as an admissible context-dependent grammar possessing two production rules of form $s|C \to \alpha_1 \beta \alpha_2$ and $s'|C' \to \alpha_3 \beta \alpha_4$, where the length of β is at least 2, the underlying contexts of β at these two locations are equal to the same context C'', either of $\alpha_1$ and $\alpha_2$ is not empty, and either $\alpha_3$ and $\alpha_4$ is not empty;

(b) defining a new production rule $s''|C'' \to \beta$, where (C'', s'') is a new pair of context and variable which is not in the domain of G; and (c) reducing G to a new context-dependent grammar G' by replacing the production rule $s|C \to \alpha_1 \beta \alpha_2$ by $s|C \to \alpha_1 s'' \alpha_2$, and by replacing the production rule $s'|C' \to \alpha_3 \beta \alpha_4$ by $s'|C' \to \alpha_3 s'' \alpha_4$, and by appending the new rule $s''|C'' \to \beta$.

6. The method according to claim 1, wherein said applying step further comprises the step of implementing a reduction rule comprising the steps of:

(a) defining G as an admissible context-dependent grammar possessing two production rules of the form $s|C \rightarrow \alpha_1\beta\alpha_2$ and $s'|C' \rightarrow \beta$, where the length of $\beta$ is at least 2, the underlying context of $\beta$ in $s|C \rightarrow \alpha_1\beta\alpha_2$ is also equal to C', and either of $\alpha_1$ and $\alpha_2$ is not empty;

(b) reducing G to the context-dependent grammar G' obtained by replacing said production rule $s|C \rightarrow \alpha_1\beta\alpha_2$ with a new production rule $s|C \rightarrow \alpha_1 s'\alpha_2$.

7. The method according to claim 1, wherein said applying step further comprises the step of implementing a reduction rule comprising the steps of:

(a) defining G as an admissible context-dependent grammar in which two variables s and s' under a given context C represent the same substring of an A-sequence represented by G; and (b) reducing G to a new context-dependent grammar G' by replacing each appearance of s' whenever the underlying context of s' is equal to C in the range of G by s and deleting the production rule corresponding to (C,s').

8. The method according to claim 7, wherein said reducing step further comprises the step of further reducing G' to the admissible context-dependent grammar G" obtained by deleting each said production rules corresponding to pairs of context and variable of G' that are not involved in the serial replacement process of G' if said grammar G' is not admissible.

9. A method of sequentially transforming an original data sequence $x = x_1 x_2 \ldots x_n$ comprising a plurality of symbols and associated with a known context model given by a countable context set C and a next context function $f$ into a sequence of irreducible context-dependant grammars $\{G_i\}'_{i=1}$ from which the original data sequence x can be fully recovered incrementally, wherein each context-dependent grammar $G_i$ is represented by a set of production rules $s_i|C_1 \rightarrow G_i(s_i|C_1)$ formed from a variable set $S(j_i) = \{s_0, s_1, \ldots s_{j-1}\}$ and a set $\Omega_G(K_i, j_i)$ of pairs of contexts and variables with $j_1 = 1$, $K_1 = 1$, and $\Omega_G(K_1, j_1) = \{(C_1, s_0)\}$, the method comprising the steps of:

(a) parsing the sequence $x = x_1 x_2 \ldots x_n$ into t non-overlapping substrings $\{x_1, x_2 \ldots x_{n_2}, \ldots, x_{n_{i-1}+1} \ldots x_{n_i}\}$, wherein $n_1 = 1$, $n_t = n$, and for each $1 < i \leq t$, the substring $x_{n_{i-1}+1} \ldots x_{n_i}$ (denoted by $\beta_i$) is the longest prefix of the remaining sequence of previously unparsed symbols $x_{n_{i-1}+1} \ldots x_n$ that can be represented under the context $C_{n_{i-1}+1}$ by a variable $s_j$ within a variable subset given by $\{s: s \neq s_0 \& (C_{n_{i-1}+1}, s) \in \Omega_G(K_{i-1}, j_{i-1})\}$ if such a prefix exists, and otherwise the first symbol $x_{n_{i-1}+1}$ of the remaining sequence of previously unparsed symbols, wherein $\Omega_G(K_{i-1}, j_{i-1})$ is the set of pairs of contexts and variables of the previous irreducible context-dependent grammar $G_{i-1}$, and (b) generating an irreducible context-dependent grammar $G_i$ for each $x_i \ldots x_{n_i}$ based on the current parsed substring $\beta_i = x_{n_{i-1}+1} \ldots x_{n_i}$, the current context $C_{n_{i-1}+1}$ determined from the context model, and the previous irreducible context-dependent grammar $G_{i-1}$, where $G_1$ consists of only one production rule $\{s_0|C_1 \rightarrow x_1\}$ and $(C_1, s_0)$ is the initial context and variable pair.

10. The method according to claim 9, wherein the step of parsing the sequence $x = x_1 x_2 \ldots x_n$ into a plurality of non-overlapping substrings $\{x_1, x_2 \ldots x_{n_2}, \ldots, x_{n_{i-1}+1} \ldots x_{n_i}\}$ further comprises the steps of:

(a) determining, for each $1 < i \leq t$, the context $C_{n_{i-1}+1}$ at the time instant $n_{i-1}+1$;

(b) determining if a prefix of the remaining unparsed sequence $x_{n_{i-1}+1} \ldots x_n$ can be represented under the current context $C_{n_{i-1}+1}$ by a variable $s_j$ within a variable subset given by $\{s: s \neq s_0 \& (C_{n_{i-1}+1}, s) \in \Omega_G(K_{i-1}, j_{i-1})\}$, where $\Omega_G(K_{i-1}, j_{i-1})$ is the set of pairs of contexts and variables of the previous irreducible context-dependent grammar $G_{i-1}$;

(c) setting the current parsed substring $\beta_i$ to be equal to the longest prefix $x_{n_{i-1}+1} \ldots x_{n_i}$ if $x_{n_{i-1}+1} \ldots x_{n_i}$ is represented by the variable $s_j$ under the context $C_{n_{i-1}+1}$; and (d) settteing the current parsed substring $\beta_i$ to be equal to $x_{n_{i-1}+1}$ with $n_i = n_{i-1}+1$ if no prefix of $x_{n_{i-1}+1} \ldots x_n$ can be represented under the current context $C_{n_{i-1}+1}$ by a variable $s_j$ within a variable subset given by $\{s: s \neq s_0 \& (C_{n_{i-1}+1}, s) \in \Omega_G(K_{i-1}, j_{i-1})\}$.

11. The method according to claim 9, wherein the step of generating an irreducible context-dependent grammar $G_i$ for each $x_1 \ldots x_{n_i}$ based on the current parsed substring $\beta_i = x_{n_{i-1}+1} \ldots x_{n_i}$, the current context $C_{n_{i-1}+1}$, and the previous irreducible context-dependent grammar $G_{i-1}$ further comprises the steps of:

(a) appending the variable $s_j$ to the right end of $G_{i-1}(s_0|C_1)$ to generate an admissible context-dependent grammar $G'_{i-1}$ if $n_i - n_{i-1} > 1$ and $\beta_i = x_{n_{i-1}+1} \ldots x_{n_i}$ is represented by $s_j$ under the context $C_{n_{i-1}+1}$;

(b) appending the symbol $x_{n_{i-1}+1}$ to the right end of $G_{i-1}(s_0|C_1)$ to generate an admissible context-dependent grammar $G'_{i-1}$ if $n_i - n_{i-1} = 1$; and (c) applying a set of reduction rules to $G'_{i-1}$ to generate the irreducible context-dependent grammar $G_i$ for each $x_1 \ldots x_{n_i}$.

12. The method according to claim 11, wherein said applying a set of reduction rules to $G'_{i-1}$ farther comprises the steps of:

(a) setting a grammar reduction bit $I(i-1)$ associated with the $(i-1)$th parsed substring to be equal to 1 if the admissible context-dependent grammar $G'_{i-2}$ is reducible, and 0 if $G'_{i-2}$ is irreducible;

(b) defining $\alpha$ to be the last symbol of $G_{i-1}(s_0|C_1)$;

(c) defining C to be the context of $\alpha$ in $G_{i-1}(s_0|C_1)$;

(d) defining $\beta$ to be the last symbol of $G'_{i-1}(s_0|C_1)$;

(e) determining if $\alpha\beta$ appears under the context C in two non-overlapping positions in the range of $G'_{i-1}$;

(f) setting $G_i$ to be equal to $G'_{i-1}$ if $\alpha\beta$ does not appears under the context C in two non-overlapping positions in the range of $G'_{i-1}$;

(g) applying a first reduction rule to $G'_{i-1}$ to generate $G_i$ if $I(i-1) = 0$ and $\alpha\beta$ repeats itself under the same context C in two non-overlapping positions in $G'_{i-1}(s_0|C_1)$, wherein said first reduction rule comprises the steps of:

(1) defining G as an admissible context-dependent grammar possessing a production rule of form $s|\hat{C} \rightarrow \alpha_1 \gamma \alpha_2 \gamma \alpha_3$, where the length of $\gamma$ is at least 2, and the underlying contexts of $\gamma$ at these two locations are equal to the same context C';

(2) defining a new production rule $s'|C' \rightarrow \gamma$, where (C', s') is a new pair of context and variable which is not in the domain of G; and (3) reducing G to a new context-dependent grammar $\hat{G}$ by replacing the production rule $s|\hat{C} \rightarrow \alpha_1 \gamma \alpha_2 \gamma \alpha_3$ of G with $s|\hat{C} \rightarrow \alpha_1 s'\alpha_2 s'\alpha_3$, and appending the production rule $s'|C' \rightarrow \gamma$, the resulting grammar $\hat{G}$ having a new pair of context and variable (C', s') and representing an equivalent data sequence x as does G;

(h) applying a second reduction rule to $G'_{i-1}$ to generate $G_i$ if $I(i-1) = 0$ and $\alpha\beta$ repeats itself under the same context C in two non-overlapping positions in the range of $G'_{i-1}$ but not in $G'_{i-1}(s_0|C_1)$, wherein said second reduction rule comprises the steps of:

(1) defining G as an admissible context-dependent grammar possessing two production rules of form $s|\hat{C} \to \alpha_1\gamma\alpha_2$ and $s'|C' \to \alpha_3\gamma\alpha_4$, where the length of $\gamma$ is at least 2, the underlying contexts of $\gamma$ at these two locations are equal to the same context C", either of $\alpha_1$ and $\alpha_2$ is not empty, and either $\alpha_3$ and $\alpha_4$ is not empty;

(2) defining a new production rule $s''|C'' \to \gamma$, where (C",s") is a new pair of context and variable which is not in the domain of G; and (3) reducing G to a new context-dependent grammar $\hat{G}$ by replacing the production rule $s|\hat{C} \to \alpha_1\gamma\alpha_2$ by $s|\hat{C} \to \alpha_1 s''\alpha_2$, and by replacing the production rule $s'|C' \to \alpha_3\gamma\alpha_4$ by $s'|C' \to \alpha_3 s''\alpha_4$, and by appending the new rule $s''|C'' \to \gamma$;

(i) applying said one of a first reduction rule and a second reduction rule followed by a third reduction rule if I(i−1)=1 and $\alpha\beta$ repeats itself under the same context C in two non-overlapping positions in the range of $G'_{i-1}$, wherein said third reduction rule comprises the steps of:

(1) defining s as a variable of an admissible context-dependent grammar G that appears once under some context $\hat{C}$ in the range of G;

(2) defining a production rule $s'|C' \to \alpha_1 s\beta_1$ in which s appears under the context $\hat{C}$ on the right of a group of symbols;

(3) defining a production rule $s|\hat{C} \to \gamma$ which corresponds to the pair $(\hat{C},s)$; and reducing G to an admissible context-dependent grammar $\hat{G}$ by removing said production rule $s|\hat{C} \to \gamma$ from G and replacing said production rule $s'|C' \to \alpha_1 s\beta_1$ with the production rule $s'|C' \to \alpha_1\gamma\beta_1$, the resulting admissible context-dependent grammar $\hat{G}$ and G representing an equivalent data sequence.

13. The method according to claim 12, wherein said determining step (e) further comprises the steps of:

(a) defining, for each pair $(\hat{C},\gamma) \in \Omega_G(K_{i-1},j_{i-1})$ other than the initial pair $(C_1,s_0)$, two lists $L_1(\gamma|\hat{C})$ and $L_2(\gamma|\hat{C})$, where said list $L_1(\gamma|\hat{C})$ comprises all symbols $\eta \in A \cup S(j_{i-1})$ having the following properties:

(1) the pattern $\gamma\eta$ appears under the context $\hat{C}$ in the range of $G_{i-1}$;

(2) the pattern $\gamma\eta$ is not the last two symbols of $G_{i-1}(s_0|C_1)$; and (3) there is no variable $s_i$ of $G_{i-1}$ such that $G_{i-1}(s_i|\hat{C})$ is equal to $\gamma\eta$; and where said list $L_2(\gamma|\hat{C})$ comprises all symbols $\eta \in A \cup S(j_{i-1})$ having properties (1) and (2);

(b) declaring that $\alpha\beta$ appears under the context C in two non-overlapping positions in the range of $G'_{i-1}$ if $\beta$ appears in the list $L_1(\alpha|C)$.

14. A method of encoding an original data sequence comprising a plurality of symbols and associated with a known context model given by a countable context set C and a next context function $f$ by using an adaptive context-dependent arithmetic code to encode an irreducible context-dependent grammar from which the original data sequence can be fully recovered, wherein the irreducible context-dependent grammar is represented by a set of production rules which are formed using a set of pairs of variables and contexts representing non-overlapping repeated patterns and contexts in the data sequence, the method comprising the steps of:

(a) transforming the data sequence into the irreducible context-dependent grammar from which the original data sequence can be fully recovered;

(b) converting the irreducible context-dependent grammar into its sorted form, yielding a sorted irreducible context-dependent grammar;

(c) constructing a generated sequence from the sorted irreducible context-dependent grammar; and (d) encoding the generated sequence using an adaptive context-dependent arithmetic code with dynamic alphabets.

15. The method according to claim 14, wherein said transforming step (a) further comprises the steps of:

(1) parsing a substring from the sequence, wherein the substring is the longest prefix of a string of previously unparsed symbols of the sequence that can be represented, under the context of the current time instant, by a variable within the set of variables of a previous irreducible context-dependent grammar other than the initial variable in the initial pair of the set of pairs of variables and contexts if such a prefix exists, and otherwise a first symbol of the string of the previously unparsed symbols in the sequence;

(2) generating an admissible context-dependent grammar based on the substring, the current context, and the previous irreducible context-dependent grammar;

(3) applying at least one set of reduction rules to the admissible context-dependent grammar to generate a new irreducible context-dependent grammar; and (4) repeating steps (1) through (3) until all of the symbols of the sequence are processed and the desired final irreducible context-dependent grammar is obtained.

16. The method according to claim 14, wherein an irreducible context-dependent grammar G with a variable set $S(j)=\{s_0,s_1,\ldots s_{j-1}\}$ and a set $\Omega_G(K,j)$ of pairs of contexts and variables is said to be of sorted form if for each legitimate context C, the replacement of $(C,s_i)$ always takes place before that of $(C,s_{i+1})$ for any meaningful i>0 in the following recursive replacement procedure:

(1) Let $\Omega_G$ denote a dynamically changing subset of $\Omega_G(K,j)$; initially, $\Omega_G$ is empty;

(2) Set $u^{(0)}=G(s_0|C_1)$ and i=0;

(3) For $i \geq 0$, read $u^{(i)}$ from left to right; replace the first pair (C,s) which is not in $\Omega_G$ by G(s|C), where C is the context for s determined by the context model;

(4) Update $\Omega_G$ by inserting the pair (C,s) into $\Omega_G$;

(5) Repeat steps (3) and (4) for i=0,1, ... $|\Omega_G(K,j)|-1$ so that each pair $(C,s) \in \Omega_G(K,j)$ other than $(C_1,s_0)$ is replaced by G(s|C) exactly once; and Said converting step (b) further comprises the step of renaming, under each legitimate context C, variables $s_i$ so that for renamed variables, the replacement of $(C,s_i)$ always takes place before that of $(C, s_{i+1})$ for any meaningful i>0 in said recursive replacement procedure.

17. The method according to claim 14, wherein said constructing step (c) further comprises the steps of:

(1) defining a sorted irreducible context-dependent grammar G with a variable set $S(j)=\{s_0,s_1,\ldots s_{j-1}\}$ and a set $\Omega_G(K,j)$ of pairs of contexts and variables;

(2) initializing $\Omega_G$ to be an empty set;

(3) setting $u^{(0)}=G(s_0|C_1)$ and i=0;

(4) reading $u^{(i)}$, for $i \geq 0$, from left to right, and replacing the first pair (C,s) which is not in $\Omega_G$ by [G(s|C)], where C is the context for s determined by the context model;

(5) updating $\Omega_G$ by inserting the pair (C,s) into $\Omega_G$;

(6) repeating steps (4) and (5) for i=0,1, ... $|\Omega_G(K,j)|-1$ so that each pair $(C,s) \in \Omega_G(K,j)$ other than $(C_1,s_0)$ is replaced by [G(s|C)] exactly once, the final sequence $u^{(|\Omega_G(K,j)|-1)}$ being the generated sequence from G.

18. The method according to claim 14, wherein said encoding step (d) further comprises the steps of:

(1) extending the next context function $f$ to include $C=f(C,[)$ and $C=f(C,])$ for any context $C$;

(2) associating each pair $(C,\alpha)$ with a counter $c(C,\alpha)$, where $C$ is a context and $\alpha$ is a symbol, variable, or bracket ([ or ]);

(3) initializing $c(C,\alpha)$ to be 1 if $\alpha$ is a symbol in the original data sequence or bracket ([ or ]), and 0 otherwise;

(4) encoding each symbol $\beta$ of the generated sequence conditioned on its context $C$ and based on the counter $c(C,\beta)$ divided by the sum of all counters $c(C,\alpha)$ over all $\alpha$ satisfying $c(C,\alpha) \neq 0$;

(5) increasing $c(C,\beta)$ by 1;

(6) increasing $c(C',s_1)$ from 0 to 1 whenever $\beta$ is equal to the bracket ] and the legitimate bracket pair corresponding to $\beta$ is the ith bracket pair under the context $C'$ counted from the left of the generated sequence, where $C'$ is the context for the left bracket [ of this bracket pair;

(7) determining the context for the next symbol in the generated sequence; and (8) repeating steps (4) through (7) until all symbols in the generated sequence are encoded.

19. A method of sequentially transforming an original data sequence $x=x_1x_2 \ldots x_n$ into a sequence of irreducible context-dependant grammars $\{G_i\}'_{i=1}$ and encoding the data sequence by using an adaptive context-dependent arithmetic code to encode the final irreducible context-dependent grammar $G_t$, wherein the data sequence $x=x_1x_2 \ldots x_n$ comprises a plurality of symbols and is associated with a known context model given by a countable context set $C$ and a next context function $f$, and each context-dependent grammar $G_i$ is represented by a set of production rules $s_i|C_1 \rightarrow G_i(s_i|C_1)$ formed from a variable set $S(j_i)=\{s_0,s_1,\ldots s_{j_i-1}\}$ and a set $\Omega_G(K_i,j_i)$ of pairs of contexts and variables with $j_1=1$, $K_1=1$, and $\Omega_G(K_1,j_1)=\{(C_1,s_0)\}$, the method comprising the steps of:

(a) parsing the sequence $x=x_1x_2 \ldots x_n$ into $t$ non-overlapping substrings $\{x_1,x_2 \ldots x_{n_1}, \ldots, x_{n_{i-1}+1} \ldots x_{n_i}\}$, wherein $n_1=1$, $n_t=n$, and for each $1<i \leq t$, the substring $x_{n_{i-1}+1} \ldots x_{n_i}$ (denoted by $\beta_i$) is the longest prefix of the remaining sequence of previously unparsed symbols $x_{n_{i-1}+1} \ldots x_n$ that can be represented under the context $C_{n_{i-1}+1}$ by a variable $s_j$ within a variable subset given by $\{s:s \neq s_0 \& (C_{n_{i-1}+1},s) \in \Omega_G(K_{i-1},j_{i-1})\}$ if such a prefix exists, and otherwise the first symbol $x_{n_{i-1}+1}$ of the remaining sequence of previously unparsed symbols, wherein $\Omega_G(K_{i-1},j_{i-1})$ is the set of pairs of contexts and variables of the previous irreducible context-dependent grammar $G_{i-1}$, and (b) generating an irreducible context-dependent grammar $G_i$ for each $x_1 \ldots x_{n_i}$ based on the current parsed substring $\beta_i=x_{n_{i-1}+1} \ldots x_{n_i}$, the current context $C_{n_{i-1}+1}$ determined from the context model, and the previous irreducible context-dependent grammar $G_{i-1}$, where $G_1$ consists of only one production rule $\{s_0|C_1 \rightarrow x_1\}$ and $(C_1,s_0)$ is the initial context and variable pair;

(c) converting the final irreducible context-dependent grammar $G_t$ into its sorted form $G_t^s$;

(d) constructing a generated sequence from the sorted irreducible context-dependent grammar $G_t^s$; and (e) encoding the generated sequence using an adaptive context-dependent arithmetic code with dynamic alphabets.

20. A method of sequentially transforming a data sequence into a sequence of irreducible context-dependent grammars and encoding the data sequence based on each of the irreducible context-dependent grammars by using adaptive context-dependent arithmetic coding, wherein the data sequence comprises a plurality of symbols and is associated with a known context model given by a countable context set $C$ and a next context function $f$, and each irreducible context-dependent grammar is represented by a set of production rules which are formed using a set of pairs of variables and contexts representing non-overlapping repeated patterns and contexts in the data sequence, the method comprising the steps of:

(a) parsing a substring from the sequence, wherein the substring is the longest prefix of a string of previously unparsed symbols of the sequence that can be represented, under the context of the current time instant, by a variable within the set of variables of a previous irreducible context-dependent grammar other than the initial variable in the initial pair of the set of pairs of variables and contexts if such a prefix exists, and otherwise a first symbol of the string of the previously unparsed symbols in the sequence;

(b) encoding the substring by utilizing the structure of the previous irreducible context-dependent grammar and by using adaptive context-dependent arithmetic coding;

(c) generating an admissible context-dependent grammar based on the substring, the current context, and the previous irreducible context-dependent grammar;

(d) applying at least one set of reduction rules to the admissible context-dependent grammar to generate a new irreducible context-dependent grammar; and (e) repeating steps (a) through (d) until all of the symbols of the sequence are parsed and encoded.

21. A method of sequentially transforming an original data sequence $x=x_1x_2 \ldots x_n$ into a sequence of irreducible context-dependant grammars $\{G_i\}'_{i=1}$ and encoding the data sequence based on each of the irreducible context-dependent grammars $\{G_i\}'_{i=1}$ by using adaptive context-dependent arithmetic coding, wherein the data sequence $x=x_1x_2 \ldots x_n$ comprises a plurality of symbols and is associated with a known context model given by a countable context set $C$ and a next context function $f$, and each context-dependent grammar $G_1$ is represented by a set of production rules $s_i|C_1 \rightarrow G_i(s_i|C_1)$ formed from a variable set $S(j_i)=\{s_0,s_1,\ldots s_{j_i-1}\}$ and a set $\Omega_G(K_i,j_i)$ of pairs of contexts and variables with $j_1=1$, $K_1=1$, and $\Omega_G(K_1,j_1)=\{(C_1,s_0)\}$, the method comprising the steps of:

(a) associating each pair $(C,\alpha)$ with two counters $c(C,\alpha)$ and $\hat{c}(C,\alpha)$, where $C$ is a context and $\alpha$ is a symbol or variable;

(b) initializing $c(C,\alpha)$ and $\hat{c}(C,\alpha)$ to be 1 if $\alpha$ is a symbol in the original data sequence, and 0 otherwise;

(c) parsing, for each $1<i \leq t$, a substring $x_{n_{i-1}+1} \ldots x_{n_i}$ from the sequence, wherein $n_1=1$, $n_t=n$, and for each $1<i \leq t$, the substring $x_{n_{i-1}+1} \ldots x_{n_i}$ (denoted by $\beta_i$) is the longest prefix of the remaining sequence of previously unparsed symbols $x_{n_{i-1}+1} \ldots x_n$ that can be represented under the context $C_{n_{i-1}+1}$ by a variable $s_j$ within a variable subset given by $\{s:s \neq s_0 \& (C_{n_{i-1}+1},s) \in \Omega_G(K_{i-1},j_{i-1})\}$ if such a prefix exists, and otherwise the first symbol $x_{n_{i-1}+1}$ of the remaining sequence of previously unparsed symbols, wherein $\Omega_G(K_{i-1},j_{i-1})$ is the set of pairs of contexts and variables of the previous irreducible context-dependent grammar $G_{i-1}$, and wherein $G_1$ consists of only one production rule $\{s_0|C_1 \rightarrow x_1\}$ with $(C_1,s_0)$ being the initial context and variable pair;

(d) generating an admissible context-dependent grammar $G'_{i-1}$ based on the previous irreducible context-dependent grammar $G_{i-1}$, the current substring $\beta_i$, and the current context $C_{n_{i-1}+1}$;

(e) setting the current grammar reduction bit $I(i)$ to be 1 if the admissible context-dependent grammar $G'_{i-1}$ is reducible, and 0 if $G'_{i-1}$ is irreducible;

(f) encoding the current grammar reduction bit $I(i)$ using an adaptive order one or higher order arithmetic code;

(g) encoding the current substring $\beta_i$ based on the previous irreducible context-dependent grammar $G_{i-1}$, grammar reduction bits $I(i)$ and $I(i-1)$, and the current context $C_{n_{i-1}+1}$ using adaptive context-dependent arithmetic coding;

(h) applying at least one set of reduction rules to the admissible context-dependent grammar $G'_{i-1}$ to generate a new irreducible context-dependent grammar $G_i$; and (i) repeating steps (c) through (h) until all of the symbols of the sequence x are parsed and encoded.

22. The method according to claim 21, wherein said encoding step (g) further comprises the steps of:

(1) defining $\alpha$ to be the last symbol of $G_{i-1}(s_0|C_1)$;

(2) defining $\hat{C}$ to be the context of $\alpha$ in $G_{i-1}(s_0|C_1)$;

(3) defining $\beta$ to be the variable $s_j$ if $n_i-n_{i-1}>1$ and $\beta_i=x_{n_{i-1}+1}\ldots x_{n_i}$ is represented by $s_j$ under the context $C_{n_{i-1}+1}$, or simply the symbol $x_{n_{i-1}+1}$ if $n_i-n_{i-1}=1$;

(4) defining $\tilde{C}$ as the context $C_{n_{i-1}+1}$;

(5) defining, for each pair $(C,\gamma)\in\Omega_G(K_{i-1},j_{i-1})$ other than the initial pair $(C_1,s_0)$, two lists $L_1(\gamma|C)$ and $L_2(\gamma|C)$, where said list $L_1(\gamma|C)$ comprises all symbols $\eta\in A\cup S(j_{i-1})$ having the following properties:

a) the pattern $\gamma\eta$ appears under the context $C$ in the range of $G_{i-1}$;
  b) the pattern $\gamma\eta$ under the context $C$ is not the last two symbols of $G_{i-1}(s_0|C_1)$; and
  c) there is no variable $s_j$ of $G_{i-1}$ such that $G_{i-1}(s_j|C)$ is equal to $\gamma\eta$; and where said list $L_2(\gamma|C)$ comprises all symbols $\eta\in A\cup S(j_{i-1})$ having properties a) and b);

(6) encoding $\beta$ conditioned on its context $\tilde{C}$ and based on the count $c(\tilde{C},\beta)$ divided by the sum of all counters $c(\tilde{C},\gamma)$ over all $\gamma\in A\cup S(j_{i-1})\setminus L_2(\alpha|\hat{C})$ satisfying $c(\tilde{C},\gamma)\neq 0$ and then increasing $c(\tilde{C},\beta)$ by one if $I(i)=0$;

(7) encoding $\beta$ conditioned on its context $\tilde{C}$ and based on the count $\hat{c}(\tilde{C},\beta)$ divided by the sum of all counters $\hat{c}(\tilde{C},\gamma)$ over all $\gamma\in L_1(\alpha|\hat{C})$ and then increasing $\hat{c}(\tilde{C},\beta)$ by one if $I(i-1)=0$ and $I(i)=1$.

23. The method according to claim 21, wherein said step (h) further includes the step of updating lists $L_1(\gamma|C)$ and $L_2(\gamma|C)$ accordingly.

* * * * *